US008284182B2

(12) United States Patent
Yamamoto et al.

(10) Patent No.: US 8,284,182 B2
(45) Date of Patent: Oct. 9, 2012

(54) INVERTER CIRCUIT AND DISPLAY DEVICE

(75) Inventors: Tetsuro Yamamoto, Kanagawa (JP);
Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/064,110

(22) Filed: Mar. 7, 2011

(65) Prior Publication Data
US 2011/0242079 A1 Oct. 6, 2011

(30) Foreign Application Priority Data
Apr. 1, 2010 (JP) .................................. 2010-085511

(51) Int. Cl.
G09G 5/00 (2006.01)
H03K 19/094 (2006.01)
(52) U.S. Cl. ........................................ 345/211; 326/112
(58) Field of Classification Search ........................ None
See application file for complete search history.

(56) References Cited

U.S. PATENT DOCUMENTS

| 5,444,273 | A * | 8/1995 | Ueno ............................ 257/138 |
| 6,194,915 | B1 * | 2/2001 | Nakayama et al. ........... 326/121 |
| 6,809,482 | B2 * | 10/2004 | Koyama ...................... 315/169.3 |
| 7,277,071 | B2 * | 10/2007 | Oh .................................. 345/76 |
| 8,040,297 | B2 * | 10/2011 | Chung ............................ 345/76 |
| 2007/0091029 | A1 * | 4/2007 | Uchino et al. .................. 345/76 |

FOREIGN PATENT DOCUMENTS
JP 2008-083272 4/2008
* cited by examiner

Primary Examiner — Shawki S Ismail
Assistant Examiner — Crystal L Hammond
(74) Attorney, Agent, or Firm — Rader Fishman & Grauer, PLLC

(57) ABSTRACT

An inverter circuit includes: first and second transistors connected between first and second voltage lines; a fifth transistor having a drain connected to a fifth voltage line and a source connected to a gate of the second transistor; a first capacitive element between a gate and the source of the fifth transistor; a second capacitive element between a first input terminal and the source of the fifth transistor; and the third capacitive element between a second input terminal and the source of the fifth transistor. A first pulse signal into the first input terminal has a phase advanced more than a second pulse signal into the second input terminal. The second pulse signal is switched while the gate of the fifth transistor and the first voltage line are connected. The first pulse signal is switched while the gate of the fifth transistor and the first voltage line are unconnected.

18 Claims, 19 Drawing Sheets

INVERTER CIRCUIT AND DISPLAY DEVICE

BACKGROUND OF THE INVENTION

1. Field of the Invention

The present invention relates to an inverter circuit that is suitably applicable to, for example, a display device using an organic EL (Electro Luminescence) element. The present invention also relates to a display device provided with the above-mentioned inverter circuit.

2. Description of the Related Art

In recent years, in the field of display devices that display images, a display device that uses, as a light emitting element for pixel, an optical element of current-driven type whose light emission luminance changes according to the value of a flowing current, e.g. an organic EL element, has been developed, and its commercialization is proceeding. In contrast to a liquid crystal device and the like, the organic EL element is a self-luminous element. Therefore, in the display device using the organic EL element (organic EL display device), gradation of coloring is achieved by controlling the value of a current flowing in the organic EL element.

As a drive system in the organic EL display device, like a liquid crystal display, there are a simple (passive) matrix system and an active matrix system. The former is simple in structure, but has, for example, such a disadvantage that it is difficult to realize a large and high-resolution display device. Therefore, currently, development of the active matrix system is brisk. In this system, the current flowing in a light emitting element arranged for each pixel is controlled by a drive transistor.

In the above-mentioned drive transistor, there is a case in which a threshold voltage $V_{th}$ or a mobility $\mu$ changes over time, or changes from pixel to pixel due to variations in production process. When the threshold voltage $V_{th}$ or the mobility $\mu$ changes from pixel to pixel, the value of the current flowing in the drive transistor changes from pixel to pixel and therefore, even when the same voltage is applied to the gate of the drive transistor, the light emission luminance of the organic EL element varies and uniformity of a screen is impaired. Thus, there has been developed a display device in which a correction function to address a change in the threshold voltage $V_{th}$ or the mobility $\mu$ is incorporated (see, for example, Japanese Unexamined Patent Application Publication No. 2008-083272).

A correction to address the change in the threshold voltage $V_{th}$ or the mobility $\mu$ is performed by a pixel circuit provided for each pixel. As illustrated in, for example, FIG. 27, this pixel circuit includes: a drive transistor $Tr_{100}$ that controls a current flowing in an organic EL element 111, a write transistor $Tr_{200}$ that writes a voltage of a signal line DTL into the drive transistor $Tr_{100}$, and a retention capacitor $C_s$, and therefore, the pixel circuit has a 2Tr1C circuit configuration. The drive transistor $Tr_{100}$ and the write transistor $Tr_{200}$ are each formed by, for example, an n-channel MOS Thin Film Transistor (TFT).

FIG. 26 illustrates an example of the waveform of a voltage applied to the pixel circuit and an example of a change in each of a gate voltage $V_g$ and a source voltage $V_s$ of the drive transistor $Tr_{100}$. In Part (A) of FIG. 26, there is illustrated a state in which a signal voltage $V_{sig}$ and an offset voltage $V_{ofs}$ are applied to the signal line DTL. In Part (B) of FIG. 26, there is illustrated a state in which a voltage Vdd for turning on the write transistor $Tr_{200}$ and a voltage $V_{ss}$ for turning off the write transistor $Tr_{200}$ are applied to a write line WSL. In Part (C) of FIG. 26, there is illustrated a state in which a high voltage $V_{ccH}$ and a low voltage $V_{ccL}$ are applied to a power-source line PSL. Further, in Parts (D) and (E) of FIG. 26, there is illustrated a state in which the gate voltage $V_g$ and the source voltage $V_s$ of the drive transistor $Tr_{100}$ change over time in response to the application of the voltages to the power-source line PSL, the signal line DTL and the write line WSL.

From FIG. 26, it is found that a WS pulse P is applied to the write line WSL twice within 1H, a threshold correction is performed by the first WS pulse P, and a mobility correction and signal writing are performed by the second WS pulse P. In other words, in FIG. 26, the WS pulse P is used for not only the signal writing but also the threshold correction and the mobility correction of the drive transistor $Tr_{100}$.

SUMMARY OF THE INVENTION

Incidentally, in the display device employing the active matrix system, each of a horizontal drive circuit (not illustrated) that drives the signal line DTL and a write scan circuit (not illustrated) that selects each pixel 113 sequentially is configured to basically include a shift resister (not illustrated), and has a buffer circuit (not illustrated) for each stage, corresponding to each column or each row of pixels 113. For example, the buffer circuit within the write scan circuit is typically configured such that two inverter circuits are connected in series. Here, as illustrated in FIG. 28, for example, the inverter circuit has two NMOS (n-channel MOS) transistors T1 and T2. An input voltage Vin is applied to the gate of the NMOS transistor T1, the source is connected to a negative-side voltage line $L_L$, and the drain is connected to the source of T2 and an output. On the other hand, the NMOS transistor T2 is in diode connection in which the gate and the drain are connected, and the source is connected to the drain of the NMOS transistor T1 and the output, and the gate and the drain are connected to a positive-side voltage line $L_H$. Therefore, the NMOS transistor T2 has a function as load resistance. In an inverter circuit 200, an output voltage Vout is output from a connection node between the NMOS transistor T1 and the NMOS transistor T2.

FIG. 29 illustrates pulse timing of the inverter circuit 200 in FIG. 28. The operation of the inverter circuit 200 will be described below. First, when the input voltage Vin is a high voltage (Vdd), the NMOS transistor T1 is on. At the time, the NMOS transistor T2 is in the diode connection as described above, and a gate voltage and a drain voltage are both Vdd. Therefore, as illustrated in FIG. 30, a through current Id flows through the NMOS transistors T1 and T2, and a voltage of Vss+ΔV is output. Subsequently, as illustrated in FIG. 31, when a low voltage (Vss) is input into the input voltage Vin, a voltage Vgs between the gate and the source of the NMOS transistor T1 becomes 0V. Therefore, in a case in which a threshold voltage Vth of the NMOS transistor T1 is positive, the NMOS transistor T1 is turned off. At the time, the NMOS transistor T2 is in the diode connection as described above and therefore, the output of the inverter circuit 200 increases, resulting in a potential of Vdd−Vth that is a difference between the voltage Vdd on the positive-side voltage line $L_H$ and the threshold voltage Vth of the NMOS transistor T2 (FIG. 31).

In this way, in the inverter circuit 200 in related art, it is possible to obtain the output that is inverse with respect to the input, but for the low input (Vss), the output voltage becomes Vdd−Vth and includes variations in the threshold of the NMOS transistor T2. Therefore, for example, in a case of the inverter circuit 200 being applied in a write scan circuit, there has been such a shortcoming that variations in terms of the threshold correction and the mobility correction of the drive transistor $Tr_{100}$ in a pixel circuit 112 take place among the pixel circuits 112, and such variations result in variations in luminance. Further, for the high input (Vdd), the NMOS transistor T2 acts as the load resistance as described above and therefore, a through current flows from the positive-side voltage line $L_H$ to the negative-side voltage wiring $L_L$. As a result, there has been such a shortcoming that power consumption increases.

Thus, in order to address these shortcomings, an inverter circuit 300 as illustrated in FIG. 32 is conceivable. The inverter circuit 300 includes, between the transistors T1, T2 in an output stage and an input terminal IN, capacitive elements C1 and C2 and a transistor T3. In the inverter circuit 300, there is almost no time period over which the transistor T1 and the transistor T2 are on at the same time. Therefore, a through current hardly flows, and power consumption is able to be suppressed to a low level. In addition, in response to a fall in an input voltage Vin, an output voltage Vout becomes a voltage on a high voltage line $V_{H1}$ side, and in response to a rise in the input voltage Vin, the output voltage Vout becomes a voltage on a low voltage line $L_L$ side. Therefore, there are no variations in the output voltage Vout, and variations in luminance among pixels are able to be reduced.

Further, for example, as illustrated by an inverter circuit 400 in FIG. 33, it is conceivable to further provide transistors T4 and T5, between the transistors T1 and T2 in the output stage and the capacitive elements C1 and C2, in the inverter circuit 300. In this inverter circuit 400, the transistors T4 and T5 are inserted between the capacitive elements C1 and C2 and an output terminal OUT, and the capacitive elements C1 and C2 are not directly connected to the output terminal OUT. Thus, an amount of coupling ΔVx input into the gate and the source of the transistor T5 is not affected by parasitic capacitance (not illustrated) on the output stage and therefore, a voltage between the gate and the source of the transistor T5 is allowed to be increased. As a result, the inverter circuit 400 may be made faster.

Next, there will be considered a case in which the transistor property, particularly, a threshold voltage, of the transistor T5 newly inserted varies, in the inverter circuit 400 in FIG. 33. When the input voltage Vin changes from high to low, there occurs a difference in voltage between the gate and the source of the transistor T5, and thereby the transistor T5 is turned on. At the time, the voltage between the gate and the source of the transistor T5 becomes a value of ΔV1−ΔV2 as illustrated in FIG. 33. The transistor T5 operates in a saturation region when being on and thus, a current flows in the transistor T5 by this value of ΔV1−ΔV2, and the gate voltage of the transistor T2 rises. At the time, a current Ids flowing through the transistor T5 becomes the following value. In the following expression, k is a constant number determined by the size of a transistor and a process. μ is mobility, and Vth5 is a threshold voltage of the transistor T5.

$$Ids=k\mu(\Delta V1-\Delta V2-Vth5)^2$$

As apparent from the above expression, Ids is affected by the threshold voltage Vth5 of the transistor T5. Therefore, when variations occur in the threshold voltage Vth5 of the transistor T5, variations also occur in the value of Ids, varying the rising speed of the gate voltage of the transistor T2. Thus, because of the variations in the threshold voltage Vth5 of the transistor T5, variations occur in the speed (transient) of the output voltage Vout. As a result, variations in the ON time of the transistor that uses the output voltage Vout as a control pulse occur, causing defects such as unevenness and lines in a display image.

Here, the variations in the threshold voltage Vth5 are caused not only by the initial variations of the TFT but also by aged deterioration. Therefore, making an effort to address the variations in the threshold voltage Vth5 is necessary.

In view of the foregoing, it is desirable to provide an inverter circuit capable of suppressing variations in output voltage caused by variations in the threshold voltage of a transistor while suppressing power consumption, and a display device provided with the inverter circuit.

According to an embodiment of the present invention, there is provided a first inverter circuit including: a first transistor, a second transistor, a third transistor, a fourth transistor, a fifth transistor and a sixth transistor each having channels of same conduction type; a first capacitive element, a second capacitive element and a third capacitive element; and a first input terminal, a second input terminal and an output terminal. The first transistor makes or breaks electric connection between the output terminal and a first voltage line in response to a potential difference between a voltage of the first input terminal and a voltage of the first voltage line or a potential difference corresponding thereto. The second transistor makes or breaks electric connection between a second voltage line and the output terminal in response to a potential difference between a voltage of a first terminal and a voltage of the output terminal or a potential difference corresponding thereto, the first terminal being a source or a drain of the fifth transistor. The third transistor makes or breaks electric connection between a gate of the fifth transistor and the third voltage line in response to a potential difference between the voltage of the first input terminal and a voltage of a third voltage line or a potential difference corresponding thereto. The fourth transistor makes or breaks electric connection between the first terminal and the fourth voltage line in response to a potential difference between a voltage of the second input terminal and a voltage of a fourth voltage line or a potential difference corresponding thereto. The fifth transistor makes or breaks electric connection between a fifth voltage line and the first terminal in response to a voltage between terminals of the first capacitive element or a voltage corresponding thereto. The sixth transistor makes or breaks electric connection between the gate of the fifth transistor and the sixth voltage line in response to a potential difference between the voltage of the second input terminal and a voltage of a sixth voltage line or a potential difference corresponding thereto. The first and second capacitive elements are inserted in series between the first input terminal and the gate of the fifth transistor. An electrical connection point between the first and second capacitive elements is electrically connected to the first terminal. The third capacitive element is inserted between the first terminal and a gate of the fourth transistor.

According to another embodiment of the present invention, there is provided a first display device including: a display section that includes a plurality of scanning lines arranged in rows, a plurality of signal lines arranged in columns and a plurality of pixels arranged in rows and columns; and a drive section that drives each of the pixels. The drive section includes a plurality of inverter circuits each provided for each of the scanning lines. Each of the inverter circuits includes the same elements as those of the first inverter circuit described above.

According to another embodiment of the present invention, there is provided a second inverter circuit including: a first transistor, a second transistor, a third transistor, a fourth transistor, a fifth transistor and a sixth transistor each having channels of same conduction type; a first capacitive element, a second capacitive element and a third capacitive element; and a first input terminal, a second input terminal and an output terminal. A gate of the first transistor is electrically connected to the first input terminal, one terminal of a drain and a source of the first transistor is electrically connected to a first voltage line, and the other terminal of the first transistor is electrically connected to the output terminal. One terminal of a drain and a source of the second transistor is electrically connected to a second voltage line, and the other terminal of the second transistor is electrically connected to the output terminal. A gate of the third transistor is electrically connected to the first input terminal, one terminal of a drain and a source of the third transistor is electrically connected to a third voltage line, and the other terminal of the third transistor is electrically connected to a gate of the fifth transistor. A gate of the fourth transistor is electrically connected to the second input terminal, one terminal of a drain and a source of the fourth transistor is electrically connected to a fourth voltage line, and the other terminal of the fourth transistor is electrically connected to a gate of the second transistor. One terminal of a drain and a source of the fifth transistor is electrically connected to a fifth voltage line, and the other terminal of the fifth transistor is electrically connected to the gate of the second transistor. A gate of the sixth transistor is electrically connected to the second input terminal, one terminal of a drain and a source of the sixth transistor is electrically connected to a sixth voltage line, and the other terminal of the sixth transistor is electrically connected to the gate of the fifth transistor. The first and second capacitive elements are inserted in series between the first input terminal and the gate of the fifth transistor. An electrical connection point between the first and second capacitive elements is electrically connected to the gate of the second transistor. The third capacitive element is inserted between the gate of the second transistor and the gate of the fourth transistor.

According to another embodiment of the present invention, there is provided a second display device including a display section that includes a plurality of scanning lines arranged in rows, a plurality of signal lines arranged in columns and a plurality of pixels arranged in rows and columns, and a drive section that drives each of the pixels. The drive section includes a plurality of inverter circuits each provided for each of the scanning lines. Each of the inverter circuits includes the same elements as those of the second inverter circuit described above.

In the first and second inverter circuits as well as the first and second display devices according to the above-described embodiments of the present invention, between the first input terminal and the first voltage line as well as the third voltage line, the first transistor and the third transistor are provided, respectively. In addition, between the second input terminal and the fourth voltage line as well as the sixth voltage line, the fourth transistor and the sixth transistor are provided. On the other hand, the second transistor is provided between the second voltage line and the output terminal, and the fifth transistor is provided between the fifth voltage line and the gate of the second transistor. Further, between the first input terminal and the gate of the fifth transistor, the first capacitive element and the second capacitive element are inserted in series, and between the connection point between the first capacitive element and the second capacitive element and the gate of the fourth transistor, the third capacitive element is provided. Furthermore, the connection point between the first capacitive element and the second capacitive element is connected to the gate of the second transistor. Here, for example, by applying a pulse signal, which is more advanced in phase than a pulse signal inputted into the first input terminal, to the second input terminal, an influence of a threshold voltage of the fifth transistor is removed from the voltage between the gate and the source of the fifth transistor, when the voltage of the first input terminal changes from high to low. Therefore, subsequently, when a current flows in the fifth transistor after the fifth transistor is turned on, the influence of the threshold voltage of the fifth transistor is removed also from its current value.

According to another embodiment of the present invention, there is provided a third inverter circuit including: a first transistor, a second transistor, a third transistor and a fourth transistor each having channels of same conduction type; a first capacitive element, a second capacitive element and a third capacitive element; and a first input terminal, a second input terminal and an output terminal. The first transistor makes or breaks electric connection between the output terminal and the first voltage line in response to a potential difference between a voltage of the second input terminal and a voltage of a first voltage line or a potential difference corresponding thereto. The second transistor makes or breaks electric connection between a second voltage line and the output terminal in response to a potential difference between a gate voltage of the second transistor and a voltage of the output terminal or a potential difference corresponding thereto. The third transistor makes or breaks electric connection between a gate of the second transistor and the third voltage line in response to a potential difference between a voltage of the first input terminal and a voltage of a third voltage line or a potential difference corresponding thereto. The fourth transistor makes or breaks electric connection between the gate of the second transistor and the fourth voltage line in response to a potential difference between the voltage of the second input terminal and a voltage of a fourth voltage line or a potential difference corresponding thereto. The first and second capacitive elements are inserted in series between the first input terminal and the gate of the second transistor. An electrical connection point between the first and second capacitive elements is electrically connected to the output terminal. The third capacitive element is inserted between the second input terminal and the output terminal.

According to another embodiment of the present invention, there is provided a third display device including a display section that includes a plurality of scanning lines arranged in rows, a plurality of signal lines arranged in columns and a plurality of pixels arranged in rows and columns; and a drive section that drives each of the pixels. The drive section includes a plurality of inverter circuits each provided for each of the scanning lines. Each of the inverter circuits includes the same elements as those of the third inverter circuit described above.

According to another embodiment of the present invention, there is provided a fourth inverter circuit including: a first transistor, a second transistor, a third transistor and a fourth transistor each having channels of same conduction type; a first capacitive element, a second capacitive element and a third capacitive element; and a first input terminal, a second input terminal and an output terminal. A gate of the first transistor is electrically connected to the second input terminal, one terminal of a drain and a source of the first transistor is electrically connected to a first voltage line, and the other terminal of the first transistor is electrically connected to the output terminal. One terminal of a drain and a source of the second transistor is electrically connected to a second voltage line, and the other terminal of the second transistor is electrically connected to the output terminal. A gate of the third transistor is electrically connected to the first input terminal, one terminal of a drain and a source of the third transistor is electrically connected to a third voltage line, and the other terminal of the third transistor is electrically connected to a gate of the second transistor. A gate of the fourth transistor is electrically connected to the second input terminal, one terminal of a drain and a source of the fourth transistor is electrically connected to a fourth voltage line, and the other terminal of the fourth transistor is electrically connected to the gate of the second transistor. The first and second capacitive elements are inserted in series between the first input terminal and the gate of the second transistor. An electrical connection point between the first and second capacitive elements is electrically connected to the output terminal. The third capacitive element is inserted between the second input terminal and the output terminal.

According to another embodiment of the present invention, there is provided a fourth display device including a display section that includes a plurality of scanning lines arranged in rows, a plurality of signal lines arranged in columns and a plurality of pixels arranged in rows and columns; and a drive section that drives each of the pixels. The drive section includes a plurality of inverter circuits each provided for each of the scanning lines. Each of the inverter circuits includes the same elements as those of the fourth inverter circuit described above.

In the third and fourth inverter circuits, as well as the third and fourth display devices according to above-described embodiments of the present invention, between the second input terminal and the first voltage line as well as the fourth voltage, the first transistor and the fourth transistor are provided, respectively. In addition, between the first input terminal and the third voltage line, the third transistor is provided. On the other hand, between the second voltage line and the output terminal, the second transistor is provided. Further, between the first input terminal and the gate of the second transistor, the first capacitive element and the second capacitive element are inserted in series, and between the connection point between the first capacitive element and the second capacitive element and the gate of the first transistor, the third capacitive element is provided. Furthermore, the connection point between the first capacitive element and the second capacitive element is connected to the output terminal. Here, for example, by applying a pulse signal, which is more advanced in phase than a pulse signal inputted into the first input terminal, to the second input terminal, an influence of the threshold voltage of the second transistor is removed from the voltage between the gate and the source of the second transistor, when the voltage of the first input terminal changes from high to low. Therefore, subsequently, when a current flows in the second transistor after the second transistor is turned on, the influence of the threshold voltage of the second transistor is removed also from its current value.

According to the first and second inverter circuits, as well as the first and second display devices in the above-described embodiments of the present invention, there is almost no time period over which the first transistor and the second transistor are turned on at the same time, or the fourth transistor and the fifth transistor are turned on at the same time. This makes it possible to suppress power consumption, because a current (a through current) hardly flows between the voltage lines via these transistors. Further, when the voltage of the first input terminal changes from high to low, the influence of the threshold voltage of the fifth transistor is removed from the voltage between the gate and the source of the fifth transistor. As a result, when the fifth transistor is subsequently turned on and thereby a current flows in the fifth transistor, the influence of the threshold voltage of the fifth transistor may be removed also from its current value and thus, variations in the output voltage may be reduced.

According to the third and fourth inverter circuits, as well as the third and fourth display devices in the above-described embodiments of the present invention, there is almost no time period over which the first transistor and the second transistor are turned on at the same time. This makes it possible to suppress power consumption, because a current (a through current) hardly flows between the voltage lines via these transistors. Further, when the voltage of the first input terminal changes from high to low, the influence of the threshold voltage of the second transistor is removed from the voltage between the gate and the source of the second transistor. As a result, when the second transistor is subsequently turned on and thereby a current flows in the second transistor, the influence of the threshold voltage of the second transistor may be removed also from its current value and thus, variations in the output voltage may be reduced.

Other and further objects, features and advantages of the invention will appear more fully from the following description.

DETAILED DESCRIPTION OF THE PREFERRED EMBODIMENTS

Figure 32:
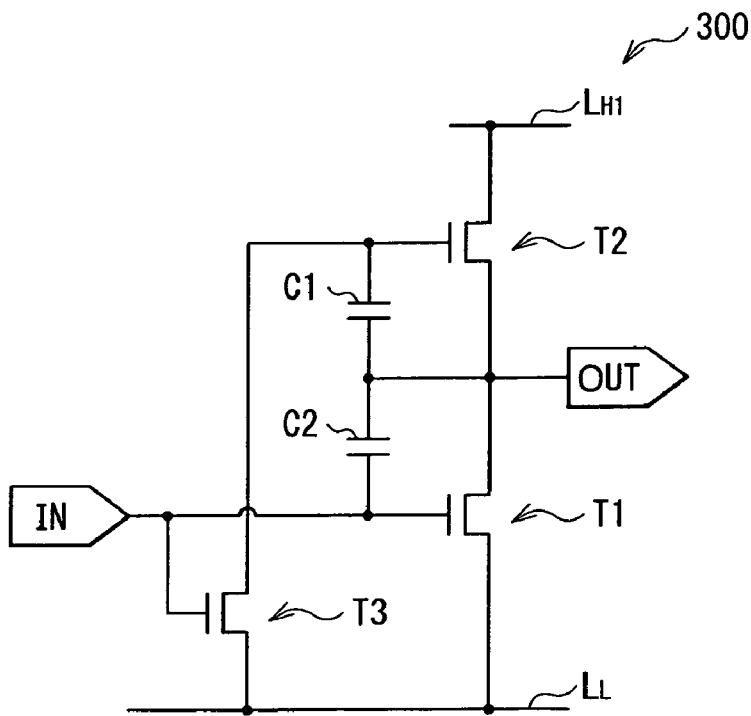
FIG. 32 is a circuit diagram illustrating another example of the inverter circuit according to a reference example.
Figure 33:
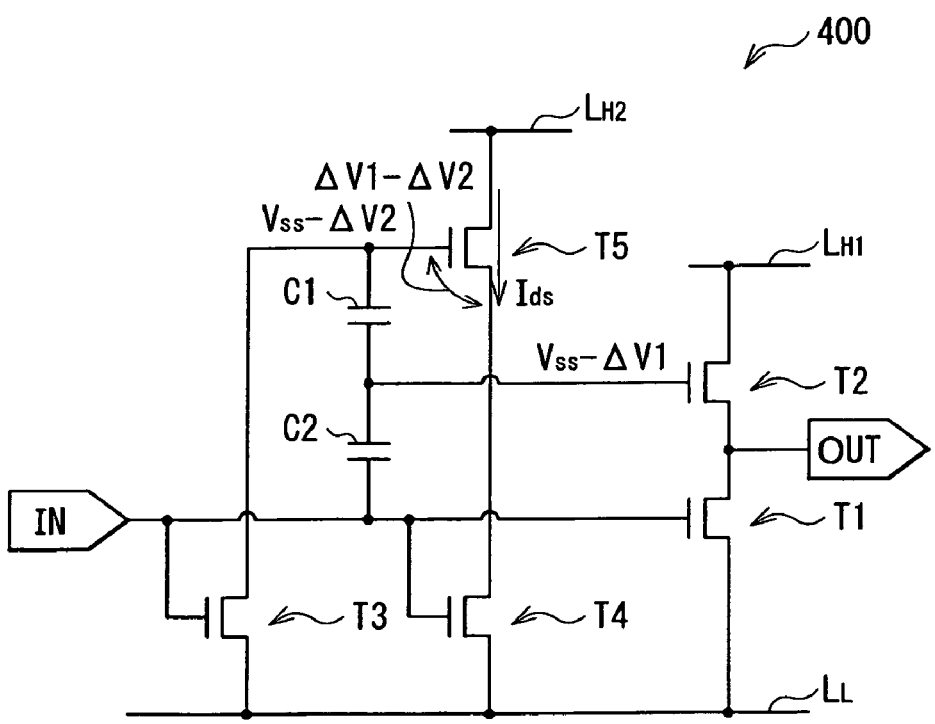
FIG. 33 is a circuit diagram illustrating an example of the inverter circuit according to another reference example.

An embodiment of the present invention will be described below in detail with reference to the drawings. Incidentally, the description will be provided in the following order.
1. Embodiment (FIG. 1 through FIG. 13)
2. Modification (FIG. 14 through FIG. 23)
3. Application example (FIG. 24 through FIG. 26)
4. Description of related art (FIG. 27 through FIG. 31)
5. Description of reference technique (FIG. 32 and FIG. 33)

Embodiment

[Configuration]

Figure 1:
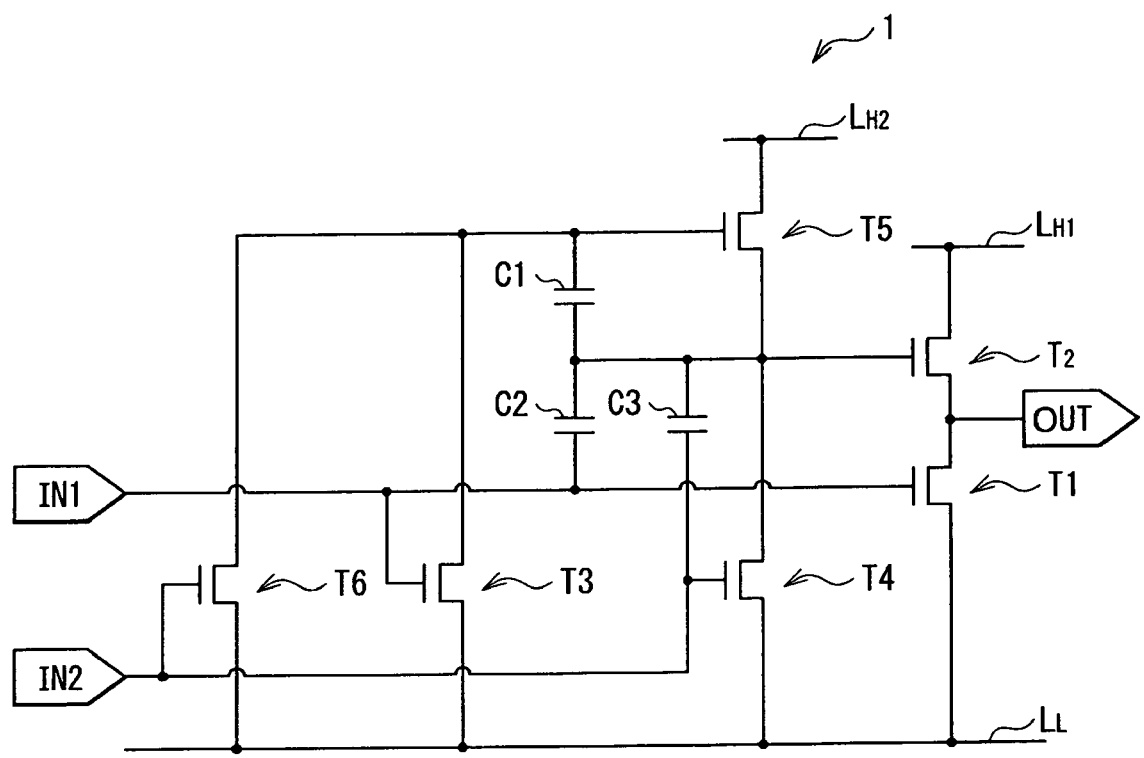
FIG. 1 is a circuit diagram illustrating an example of an inverter circuit according to an embodiment of the present invention.

FIG. 1 illustrates an example of the entire configuration of an inverter circuit 1 according to an embodiment of the present invention. The inverter circuit 1 outputs, from an output terminal OUT, a pulse signal (e.g., Part (C) of FIG. 2) whose waveform is approximately the inverse of the signal waveform of a pulse signal (e.g., Part (B) of FIG. 2) input into an input terminal IN. The inverter circuit 1 is suitably formed on an amorphous silicon or amorphous oxide semiconductor and has, for example, six transistors T1 to T6 of the same channel type. In addition to the six transistors T1 to T6, the inverter circuit 1 includes three capacitive elements C1 to C3, a first input terminal IN1, a second input terminal IN2 and the output terminal OUT, and has a 6Tr3C circuit configuration.

The transistor T1 is equivalent to a specific example of "the first transistor" according to the embodiment of the present invention, the transistor T2 is equivalent to a specific example of "the second transistor" according to the embodiment of the present invention, and the transistor T3 is equivalent to a specific example of "the third transistor" according to the embodiment of the present invention. Further, the transistor T4 is equivalent to a specific example of "the fourth transistor" according to the embodiment of the present invention, the transistor T5 is equivalent to a specific example of "the fifth transistor" according to the embodiment of the present invention, and the transistor T6 is equivalent to a specific example of "the sixth transistor" according to the embodiment of the present invention. Moreover, the capacitive element C1 is equivalent to a specific example of "the first capacitive element" according to the embodiment of the present invention, the capacitive element C2 is equivalent to a specific example of "the second capacitive element" according to the embodiment of the present invention, and the capacitive element C3 is equivalent to a specific example of "the third capacitive element" according to the embodiment of the present invention.

The transistors T1 to T6 are thin-film transistors (TFTs) of the same channel type and are, for example, n-channel MOS (Metal Oxide Film Semiconductor) type of thin-film transistors (TFTs). The transistor T1 makes or breaks electric connection between the output terminal OUT and a low voltage line $L_L$, for example, in response to a potential difference (or a potential difference corresponding thereto) between a voltage (input voltage Vin1) of the first input terminal IN1 and a voltage of the low voltage line $L_L$. The gate of the transistor T1 is electrically connected to the first input terminal IN1. The source or the drain of the transistor T1 is electrically connected to the low voltage line $L_L$. Of the source and the drain of the transistor T1, one that is a terminal unconnected with the low voltage line $L_L$ is electrically connected to the output terminal OUT. The transistor T2 makes or breaks electric connection between a high voltage line $L_{H1}$ and the output terminal OUT, in response to a potential difference (or a potential difference corresponding thereto) between a voltage of a terminal (terminal A) unconnected with a high voltage line $L_{H2}$ and a voltage (output voltage Vout) of the output terminal OUT. The terminal A is one of the source and the drain of the transistor T5. The gate of the transistor T2 is electrically connected to the terminal A of the transistor T5. The source or the drain of the transistor T2 is electrically connected to the output terminal OUT, and of the source and the drain of the transistor T2, one that is a terminal unconnected with the output terminal OUT is electrically connected to the high voltage line $L_{H1}$. The transistor T3 makes or breaks electric connection between the gate of the transistor T5 and the low voltage line $L_L$, in response to a potential difference (or a potential difference corresponding thereto) between the voltage (input voltage Vint) of the first input terminal IN1 and the voltage of the low voltage line $L_L$. The gate of the transistor T3 is electrically connected to the first input terminal IN. The source or the drain of the transistor T3 is electrically connected to the low voltage line $L_L$, and of the source and the drain of the transistor T3, one that is a terminal unconnected with the low voltage line $L_L$ is electrically connected to the gate of the transistor T5.

The transistor T4 makes or breaks electric connection between the terminal A of the transistor T5 and the low voltage line $L_L$, in response to a potential difference (or a potential difference corresponding thereto) between a voltage (input voltage Vin2) of the second input terminal 1N2 and the voltage of the low voltage line $L_L$. The gate of the transistor T4 is electrically connected to the second input terminal IN2. The source or the drain of the transistor T4 is electrically connected to the low voltage line $L_L$, and of the source and the drain of the transistor T4, one that is a terminal unconnected with the low voltage line $L_L$ is electrically connected to the terminal A of the transistor T5. The transistor T5 makes and breaks electric connection between the high voltage line $L_{H2}$ and the terminal A, in response to a between-terminal voltage (a voltage between the gate and the source of the transistor T5) of the capacitive element C1 (or a potential difference corresponding thereto). The gate of the transistor T5 is electrically connected to the terminal unconnected with the low voltage line $L_L$, of the source and the drain of the transistor T3. The source or the drain of the transistor T5 is electrically connected to the high voltage line $L_{H2}$. Of the source and the drain of the transistor T5, one that is the terminal (terminal A) unconnected with the high voltage line $L_{H2}$ is electrically connected to the gate of the transistor T2 and the terminal unconnected with the low voltage line $L_L$, of the source and the drain of the transistor T4. The transistor T6 makes or breaks electric connection between the gate of the transistor T5 and the low voltage line $L_L$, in response to a potential difference (or a potential difference corresponding thereto) between the voltage (input voltage Vin2) of the second input terminal IN2 and the voltage of the low voltage line $L_L$. The gate of the transistor T6 is electrically connected to the second input terminal 1N2. The source or the drain of the transistor T6 is electrically connected to the low voltage line $L_L$, and of the source and the drain of the transistor T6, one that is a terminal unconnected with the low voltage line $L_L$ is electrically connected to the gate of the transistor T5. In other words, the transistors T1, T3, T4 and T6 are connected to the same voltage line (low voltage line $L_L$). Therefore, the terminal on the low voltage line $L_L$ side of the transistor T1, the terminal on the low voltage line $L_L$ side of the transistor T3, the terminal on the low voltage line $L_L$ side of the transistor T4 and the terminal on the low voltage line $L_L$ side of the transistor T6 are at the same potential.

The low voltage line $L_L$ is a specific example of "the first voltage line," "the third voltage line," "the fourth voltage line" and "the sixth voltage line" according to the embodiment of the present invention. The high voltage line $L_{H1}$ is equivalent to a specific example of "the second voltage line" according to the embodiment of the present invention, and the high voltage line $L_{H2}$ is equivalent to a specific example of "the fifth voltage line" according to the embodiment of the present invention.

The high voltage lines $L_{H1}$ and $L_{H2}$ are connected to a power source (not illustrated) that outputs a voltage (constant voltage) higher than the voltage of the low voltage line $L_L$. The voltage of the high voltage line $L_{H1}$ is Vdd1 at the time of driving the inverter circuit 1, and the voltage of the high voltage line $L_{H2}$ is Vdd2 ($\cong$Vdd1+Vth2) at the time of driving the inverter circuit 1. Incidentally, the voltage Vth2 is a threshold voltage of the transistor T2. On the other hand, the low voltage line $L_L$ is connected to a power source (not illustrated) that outputs a voltage (constant voltage) lower than the voltage of the high voltage line $L_{H1}$, and the voltage of the low voltage line $L_L$ is a voltage $V_{ss}$ (<Vdd1) at the time of driving the inverter circuit 1.

The capacitive elements C1 and C2 are inserted in series between the first input terminal IN1 and the gate of the transistor T5. An electrical connection point B between the capacitive element C1 and the capacitive element C2 is electrically connected to the terminal A of the transistor T5. The capacitive element C1 is inserted on the side where the gate of the transistor T5 is provided, and the capacitive element C2 is inserted on the first input terminal IN1 side. The capacitive element C3 is inserted between the terminal A of the transistor T5 and the gate of the transistor T4. The capacity of each of the capacitive elements C1, C2 and C3 is sufficiently larger than parasitic capacitances of the transistors T1 to T6. It is desirable that the capacity of each of the capacitive elements C1, C2 and C3 satisfy the following expressions (1) and (2). If the capacitive elements C1, C2 and C3 satisfy the following expressions (1) and (2), when the input voltage Vin to be described later drops, the voltage between the gate and source of the transistor T5 may be its threshold voltage Vth5 or higher, and the transistor T5 may be in an ON state. As a result, the output voltage Vout is able to shift from low to high.

$$C2\,(Vdd1-Vss)/(C1+C2+C3) > Vth5 \quad (1)$$

$$C3\,(Vdd1-Vss)/(C1+C2+C3) > Vth5 \quad (2)$$

[Operation]

Figure 3:
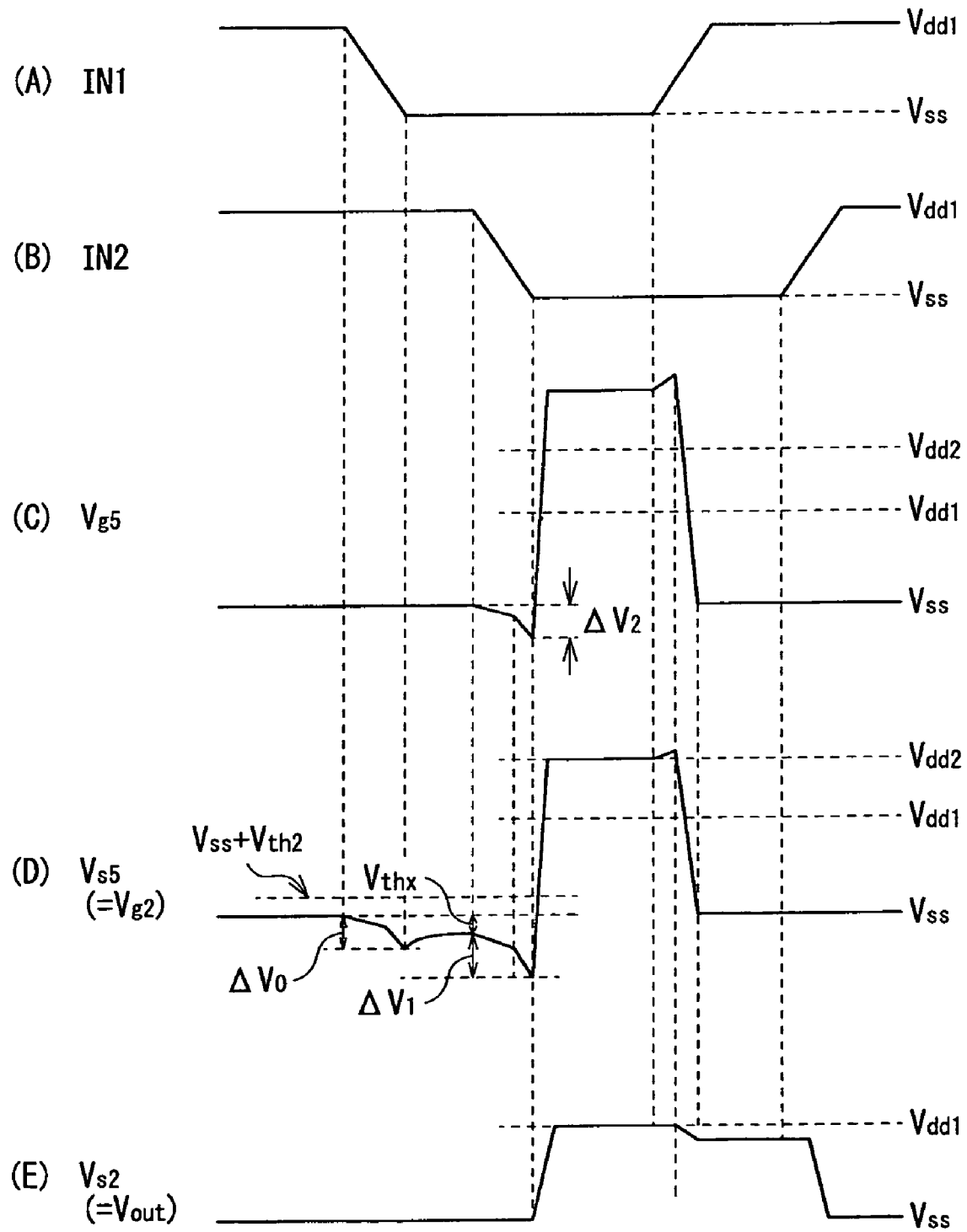
FIG. 3 is a waveform diagram illustrating an example of the operation of the inverter circuit in FIG. 1.

Next, an example of the operation of the inverter circuit 1 will be described with reference to FIG. 3 to FIG. 13. FIG. 3 is a waveform diagram illustrating an example of the operation of the inverter circuit 1. FIG. 4 through FIG. 13 are circuit diagrams illustrating an example of a series of operation of the inverter circuit 1.

Figure 4:
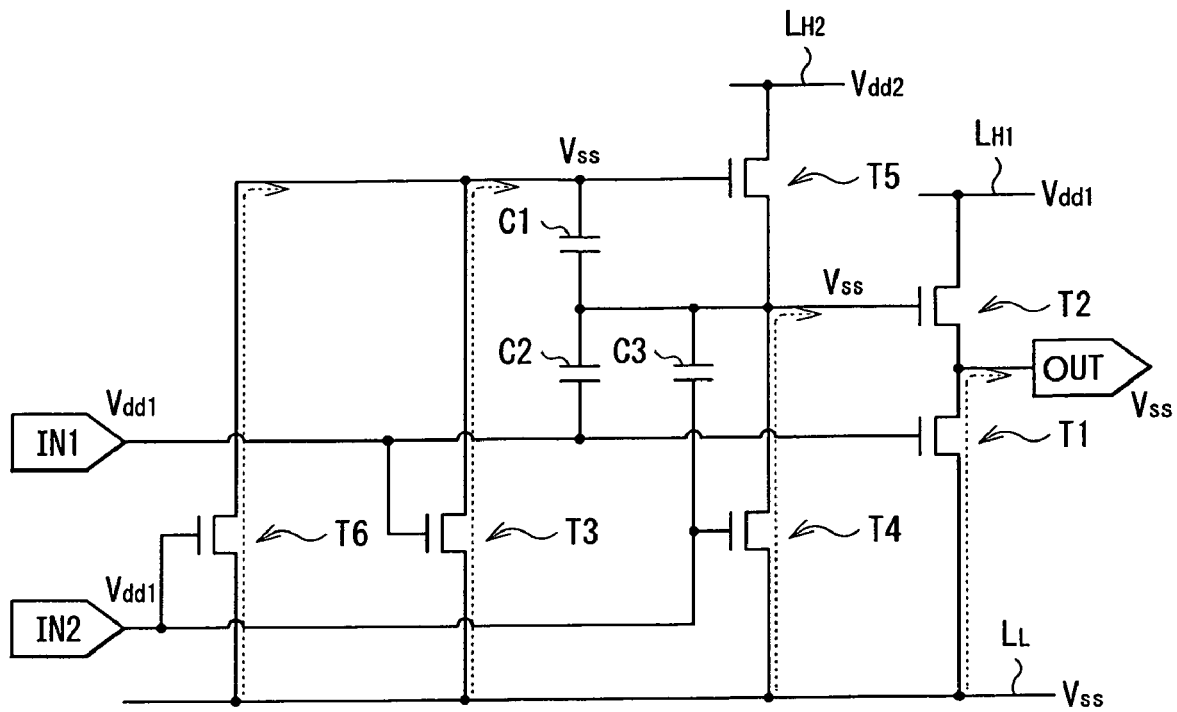
FIG. 4 is a circuit diagram for explaining an example of the operation of the inverter circuit in FIG. 1.

First, when the input voltages Vin1 and Vin2 are high (Vdd1), as illustrated in FIG. 4, the transistors T1, T3, T4 and T5 are on, and the gate voltages and the source voltages of the transistors T2 are T5 are charged to Vss. At the time, the capacitive elements C2 and C3 are both charged with a voltage of Vdd–Vss.

Next, while the input voltage Vin1 stays high (Vdd1), when the input voltage Vin2 changes from high (Vdd1) to low (Vss) (FIG. 5), the gate voltages of the transistors T4 and T6 change from Vdd1 to Vss. At the time, an amount of change in voltage of the input voltage Vin2 is input into the gate of the transistor T2 via the capacitive element C3. At this moment, the gate of the transistor T5 is charged to Vss by the transistor T3 and thus, its voltage remains as Vss (because the input voltage Vin1 is high (Vdd1)).

Here, when the input voltage Vin2 is a large voltage, in other words, when the transistor T4 is on, a current flows from the low voltage line $L_L$, and the transistor T4 attempts to charge the gate of the transistor T2 to Vss. Further, when the voltage between the gate and the source of the transistor T5 goes beyond the threshold voltage of the transistor T5, the transistor T5 is turned on, and a current flows from the high voltage line $L_{H2}$, causing the gate voltage of the transistor T2 to rise. Because the gate voltage of the transistor T4 falls from Vdd1 to Vss, on-resistance of the transistor T4 gradually increases, and a transient of charging the gate of the transistor T5 to Vss becomes slow.

Figure 5:
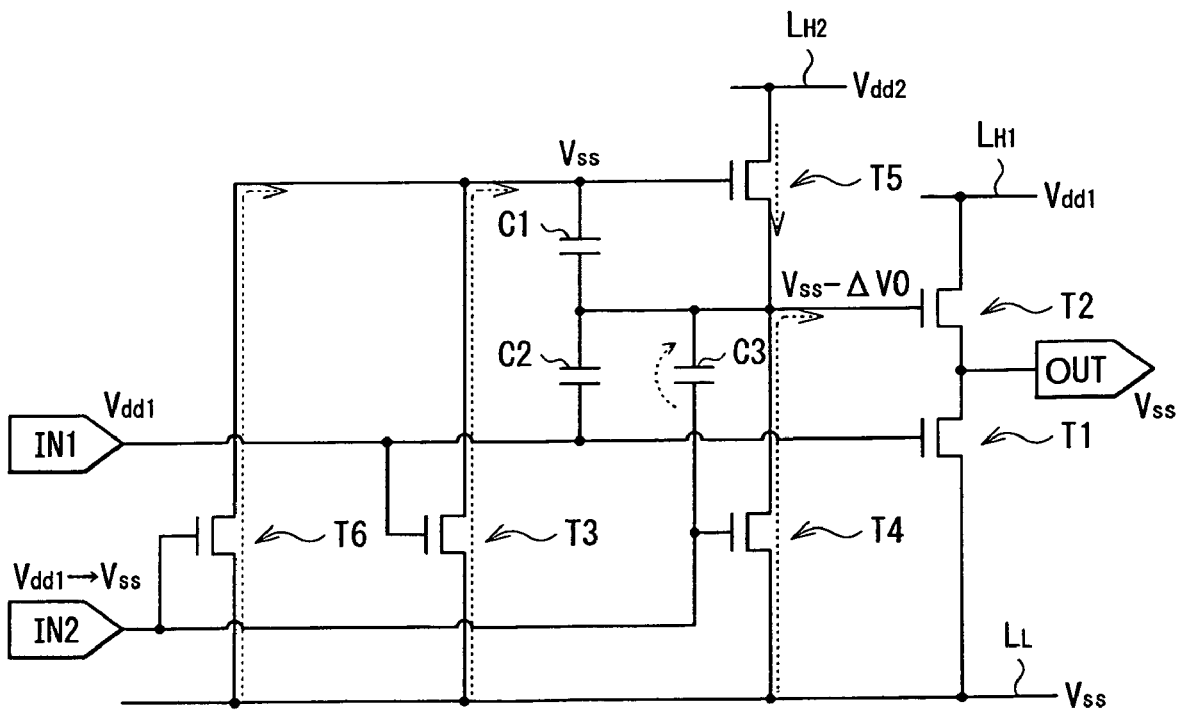
FIG. 5 is a circuit diagram for explaining an example of the operation following FIG. 4.

Eventually, when the input voltage Vin2 becomes low (Vss) from high (Vdd1), a potential difference of $\Delta V0$ is produced between the gate and the source of the transistor T5, as illustrated in FIG. 3 and FIG. 5. When this potential difference is larger than the threshold voltages of the transistors T5 and T4, the transistors T5 and T4 are turned on, a current flows from the high voltage line $L_{H2}$ to the transistor T5, and a current flows from the high voltage line $L_{H1}$ to the transistor T4.

Figure 6:
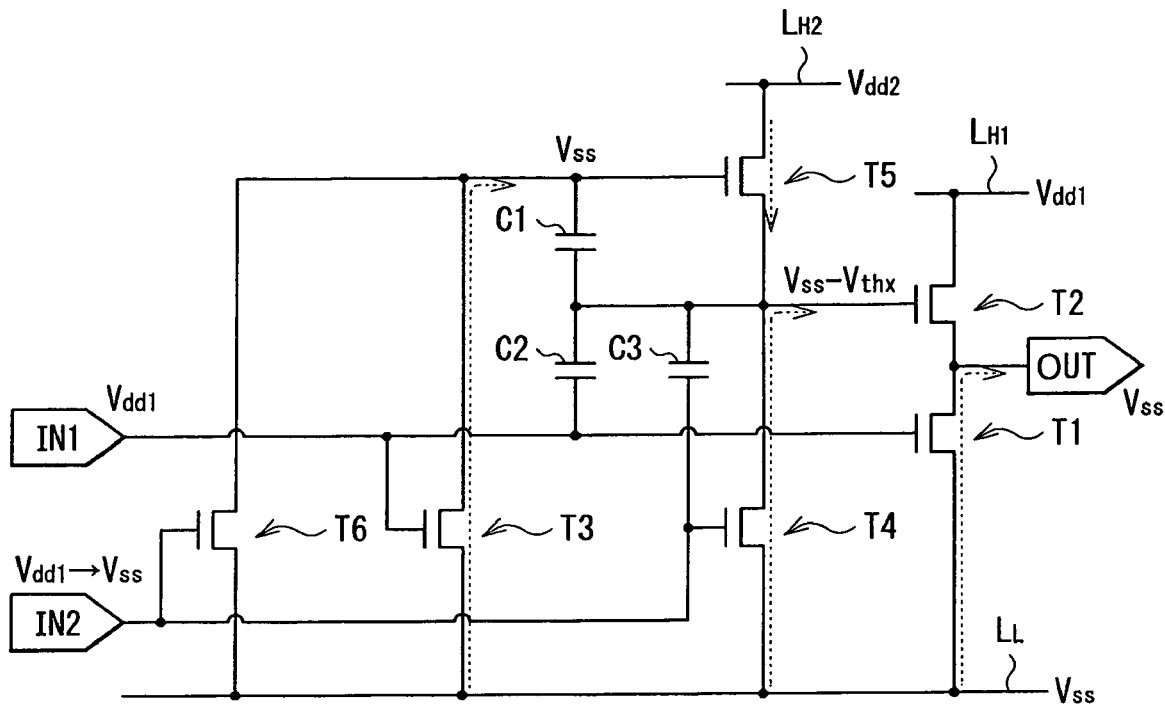
FIG. 6 is a circuit diagram for explaining an example of the operation following FIG. 5.

Here, the transistors T4 and T5 are on in a saturation region, and their gate voltages are Vss and thus, the gate voltage of the transistor T2 gradually rises by the transistors T4 and T5. After a lapse of a certain time period, the voltage between the gate and the source of the transistor T5 becomes a voltage that reflects a threshold voltage Vthx of a synthetic transistor in which the transistors T4 and T5 are connected in parallel (FIG. 6).

Figure 7:
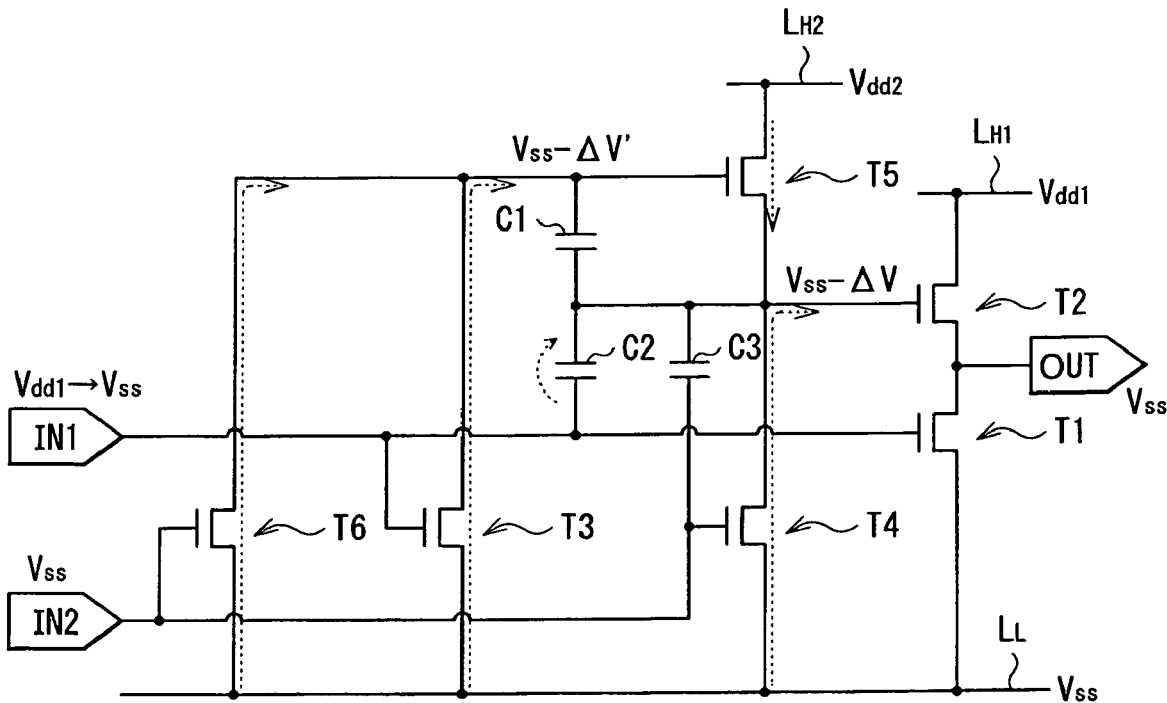
FIG. 7 is a circuit diagram for explaining an example of the operation following FIG. 6.

Subsequently, in turn, the input voltage Vin1 changes from high (Vdd1) to low (Vss). Through the operation similar to that of the input voltage Vin2 described above, an amount of change in voltage of the input voltage Vin1 is input into the gate of the transistor T2 via the capacitive element C2 as a voltage of $\Delta V$. Further, a voltage of $\Delta V'$ is also input into the gate of the transistor T5 via the capacitive element C1 (FIG. 7). When the value of the input voltage Vin1 is large, the transistor T3 is on and thus attempts to charge the gate of the transistor T5 to Vss. In addition, because the transistors T4 and T5 are also turned on, the transistor T5 also allows a current to flow from the high voltage line $L_{H2}$, which causes the gate voltage of the transistor T2 to rise.

Here, full capacities seen from the gates of the transistors T2 and T5 will be compared to each other. To the gate of the transistor T2, the capacitive element C1 and the capacitive elements C2 and C3 appear to be connected in parallel, whereas to the gate of the transistor T5, the capacitive element C1 and the capacitive elements C2 and C3 connected in parallel appear to be connected in series. Therefore, the gate of the transistor T5 appears to be smaller in capacity than the gate of the transistor T2. This shows that the gate of the transistor T2 is able to make the transient slower than the gate of the transistor T5. In other words, in terms of the time it takes to charge the gate voltages of the transistors T5 and T2 to Vss, by flowing a current as illustrated in FIG. 7, the gate of the transistor T5 is faster than the gate of the transistor T2.

Figure 8:
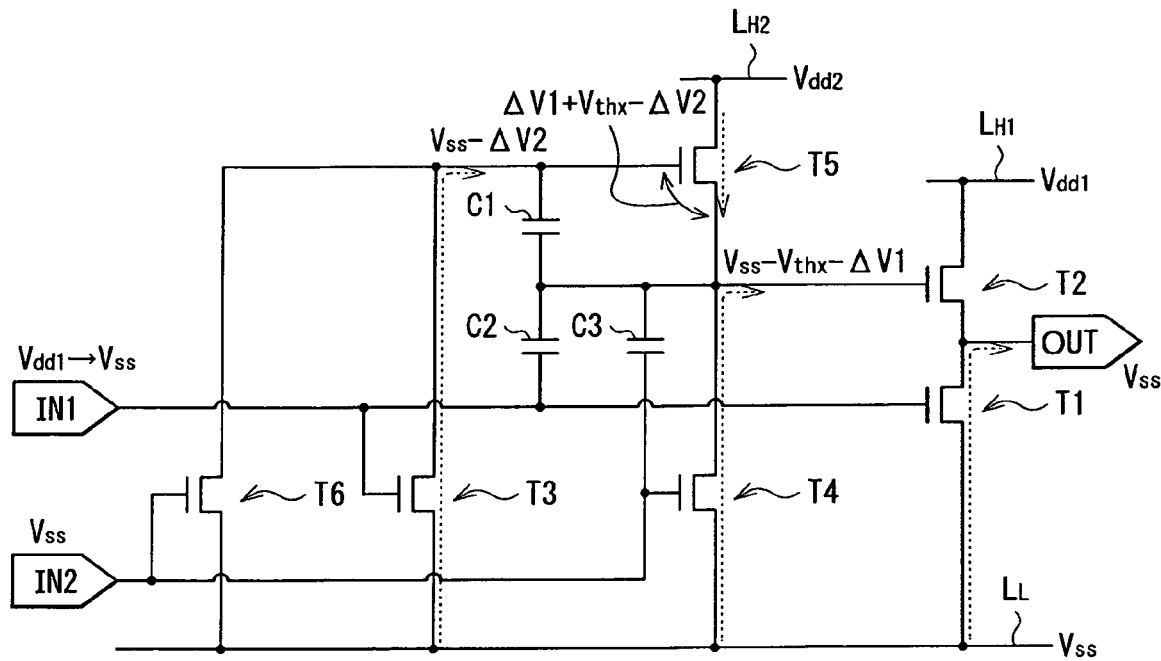
FIG. 8 is a circuit diagram for explaining an example of the operation following FIG. 7.

Eventually, when the input voltage Vin1 becomes low (Vss) from high (Vdd1), between the gate and the source of the transistor T5, a potential difference of $\Delta V1 + Vthx - \Delta V2$ is produced as illustrated in FIG. 8. When this potential difference is larger than the threshold voltage Vth5 of the transistor T5, the transistor T5 is turned on, and a current flows from the high voltage line $L_{H2}$. At this moment, a current Ids flowing from the high voltage line $L_{H2}$ is a value expressed by the following expression. Vthx is a threshold voltage of a synthetic transistor based on the transistor T4 and the transistor T5, and reflects the value of the threshold voltage Vth5 of the transistor T5 and therefore, Ids is hardly affected by the threshold voltage Vth5 of the transistor T5.

$$Ids = ku\,(\Delta V1 - \Delta V2 + Vthx - Vth5)^2$$

Here, the values of the capacitive element C2 and the capacitive element C3 will be considered. It is desirable that an amount of coupling applied to the gate of the transistor T2 via the capacitive element C2 be larger than an amount of coupling applied via the capacitive element C3. The reason is that the amount of coupling via the capacitive element C3 necessitates the voltage between the gate and the source of the transistor T5 to be equal to or larger than the threshold voltages of the transistors T4 and T5 and therefore, it may be smaller than the amount of coupling of the capacitive element C3 that determines the speed of the inverter.

Upon turning on of the transistor T5, the gate voltage of the transistor T2 rises due to the current of the transistor T5 in addition to the current from the transistor T4. In addition, between the gate and the source of the transistor T5, the capacitive element C1 for bootstrap is connected and thus, the gate voltage of the transistor T5 also rises as the gate voltage of the transistor T2 rises in an interlocking manner. When the gate voltage of the transistor T5 becomes Vss−Vth3 or more, and the gate voltage of the transistor T2 becomes Vss−Vth4 or more, the transistors T3 and T4 are turned off, and the voltage of each point increases only by the current from the transistor T5. Incidentally, Vth3 is a threshold voltage of the transistor T3, and Vth4 is a threshold voltage of the transistor T4.

Figure 9:
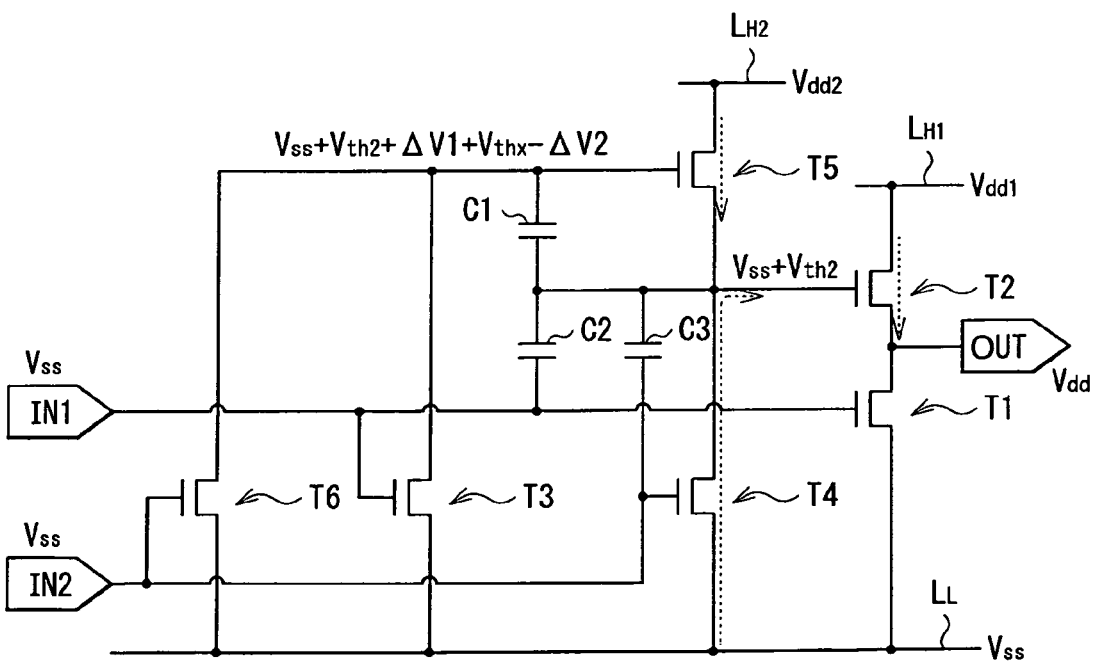
FIG. 9 is a circuit diagram for explaining an example of the operation following FIG. 8.

After a lapse of a certain time period, when the gate voltage of the transistor T2 becomes Vss+Vth2, the transistor T2, in turn, is turn on. Here, Vth2 is a threshold voltage of the transistor T2. By the turning on of the transistor T2, the transistor T2 allows the current to flow from the high voltage line $L_{H1}$, and the output voltage that is a source voltage of the transistor T2 starts rising from Vss (FIG. 9).

Figure 10:
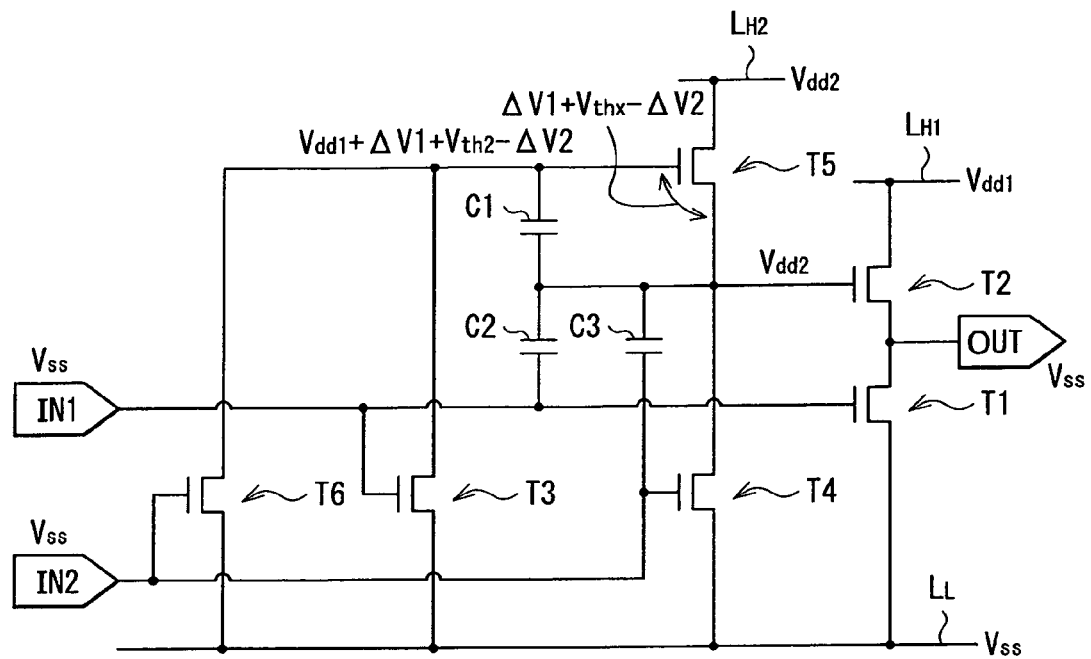
FIG. 10 is a circuit diagram for explaining an example of the operation following FIG. 8.

The gate voltage of the transistor T2 eventually increases to the voltage of the high voltage line $L_{H2}$ by the transistor T5. Here, as described earlier, the voltage of the high voltage line $L_{H2}$ is set to satisfy Vdd2≧Vdd1+Vth2. Therefore, the transistor T2 outputs Vdd1 that is the voltage of the high voltage line $L_{H1}$ as the output voltage Vout (FIG. 10).

Figure 11:
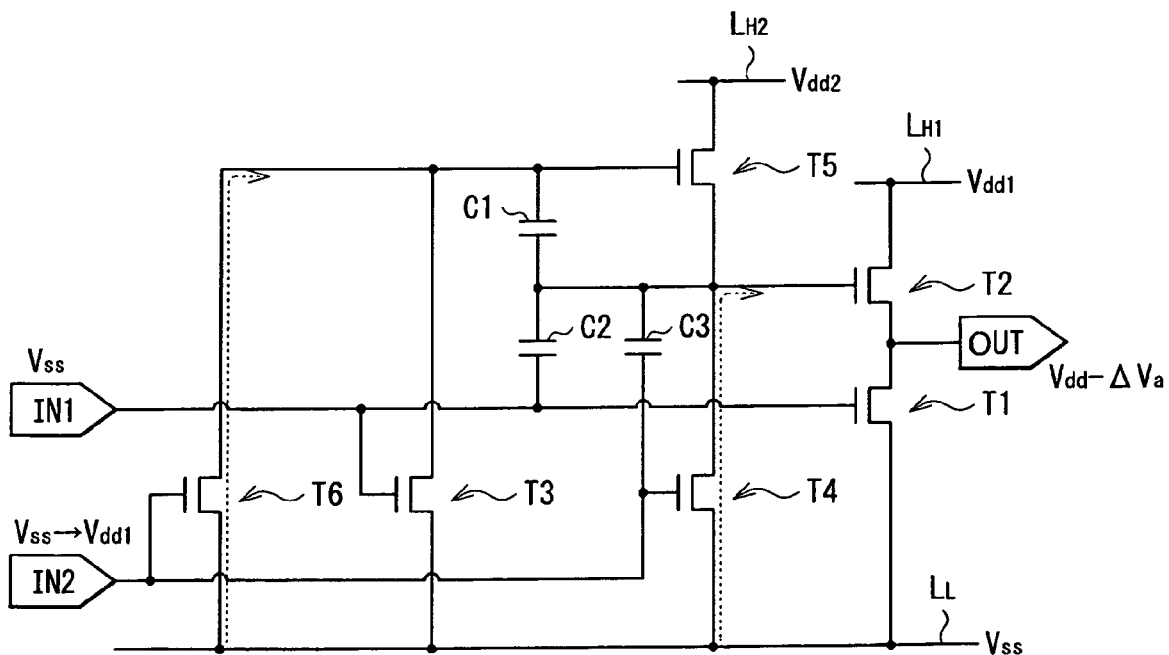
FIG. 11 is a circuit diagram for explaining an example of the operation following FIG. 9.
Figure 12:
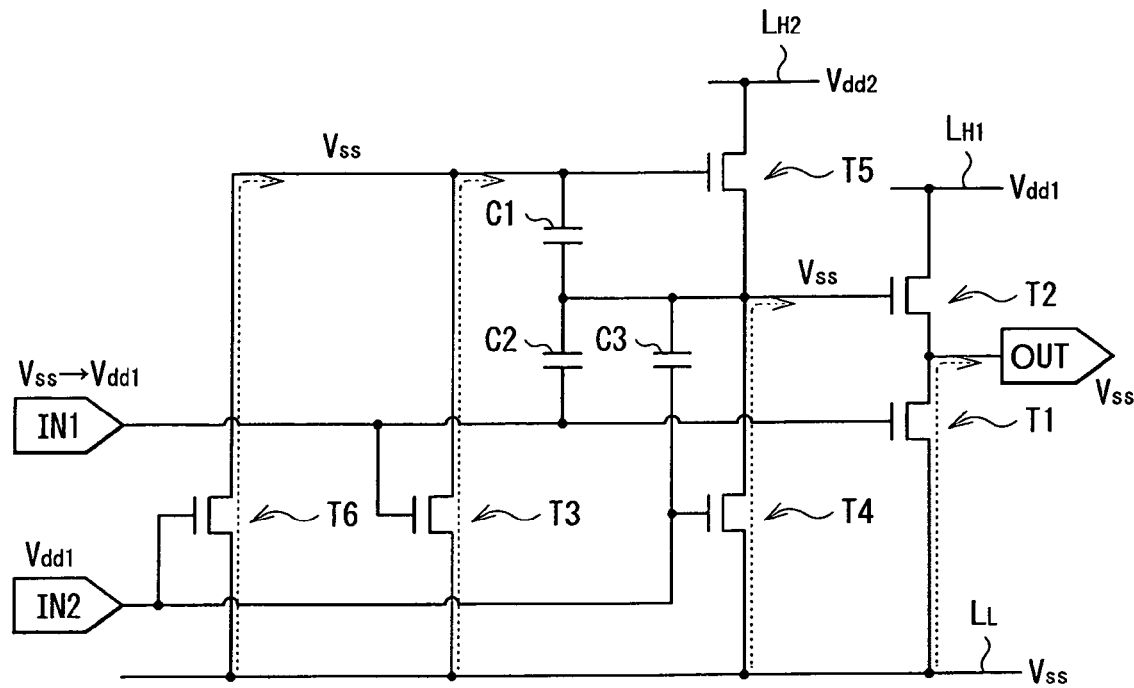
FIG. 12 is a circuit diagram for explaining an example of the operation following FIG. 10.

Subsequently, further, after a lapse of a certain time period, the input voltage Vin2 changes from low (Vss) to high (Vdd1) (FIG. 11). At this moment, when the input voltage Vin2 is smaller than Vss+Vth4 and Vss+Vth6, the transistor T4 and the transistor T6 are off and thus, coupling is input into each point via the capacitive elements C3 and C1, causing the respective voltages to rise. When the input voltage Vin2 becomes larger than Vss+Vth4 and Vss+Vth6, the transistor T4 and the transistor T6 are turned on, so that a current flows to the gate of the transistor T2 and the gate of the transistor T5 as illustrated in FIG. 11, and thereby each point is charged to Vss. Here, in contrast to the foregoing, the gate voltage of the transistor T4 increases from Vss to Vdd1 and thus, the on-resistance of the transistor T4 gradually decreases, and the transient for charging the gate of the transistor T2 and the gate of the transistor T5 to Vss becomes fast.

At the time, because the transistor T4 is turned on, and the gate of the transistor T2 changes to Vss, the amount of a change in the gate voltage of the transistor T2 is input into the source by a parasitic capacitance between the gate and the source of the transistor T2, and the output voltage Vout becomes a voltage of Vdd−Va.

Figure 13:
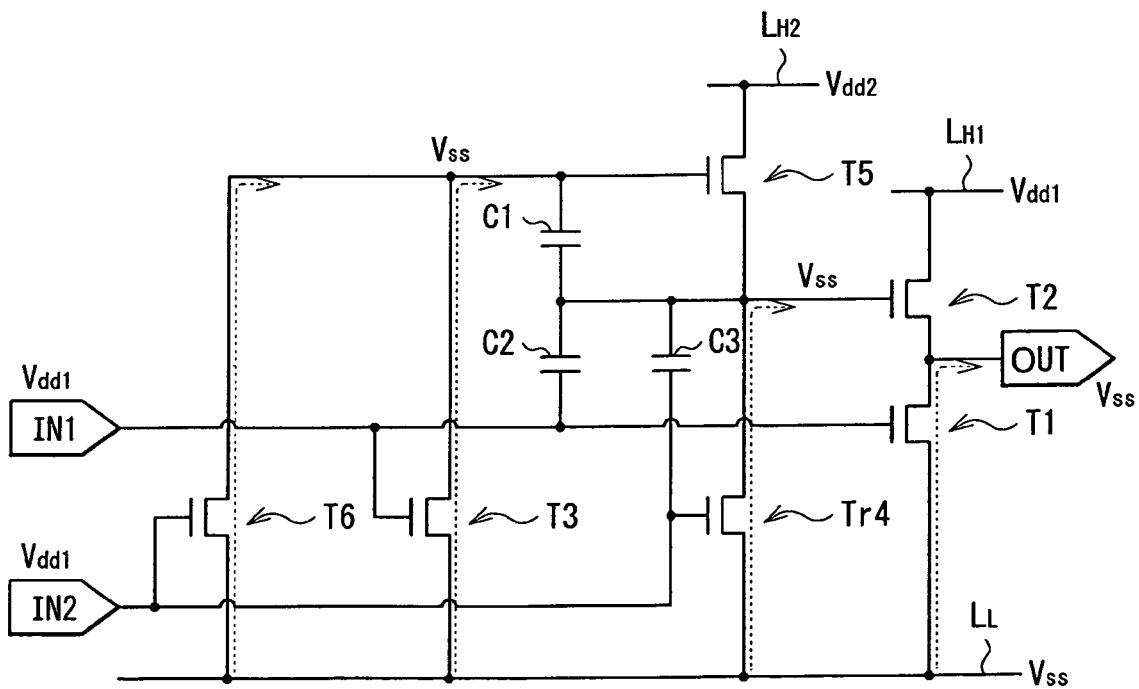
FIG. 13 is a circuit diagram for explaining an example of the operation following FIG. 11.
Figure 14:
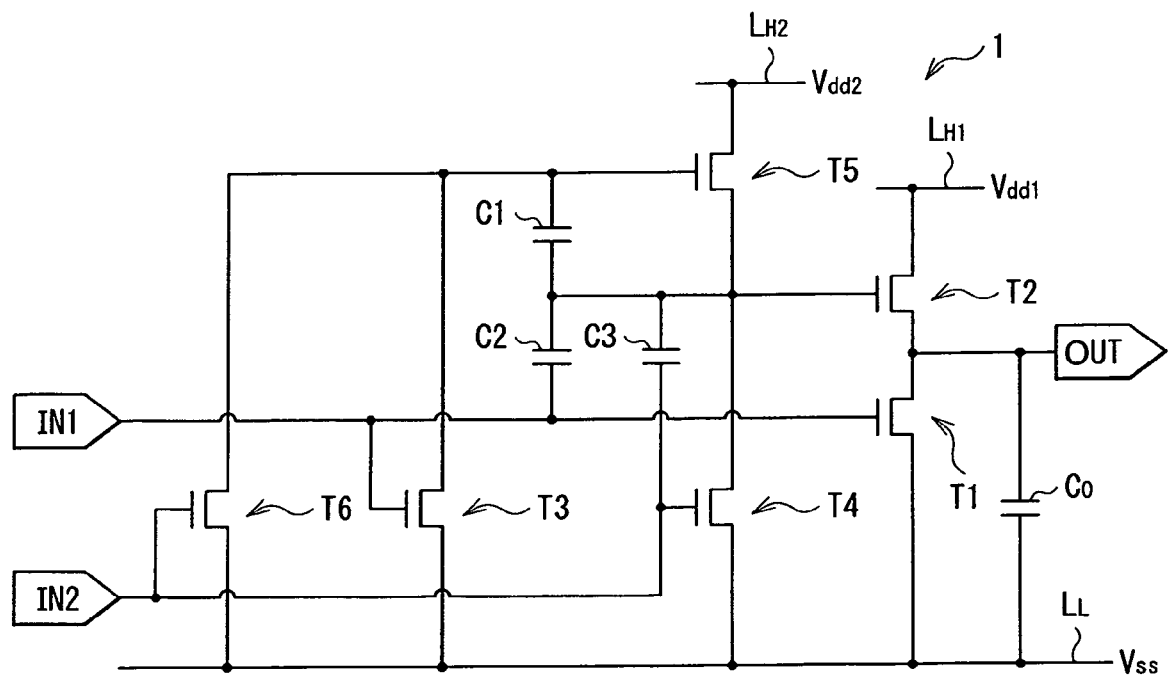
FIG. 14 is a circuit diagram illustrating a first modification of the inverter circuit in FIG. 1.

Subsequently, the input voltage Vin1 changes from low (Vss) to high (Vdd1). Like the input voltage Vin2, the transistors T1 and T3 are turned on, and the output voltage Vout gradually falls from Vdd−Va to Vss (FIG. 12), as well in this time. Eventually, the gate voltage and the source voltage of the transistor T2 as well as the gate voltage of the transistor T5 become Vss, and Vss is output to the output voltage Vout (FIG. 13).

Figure 2:
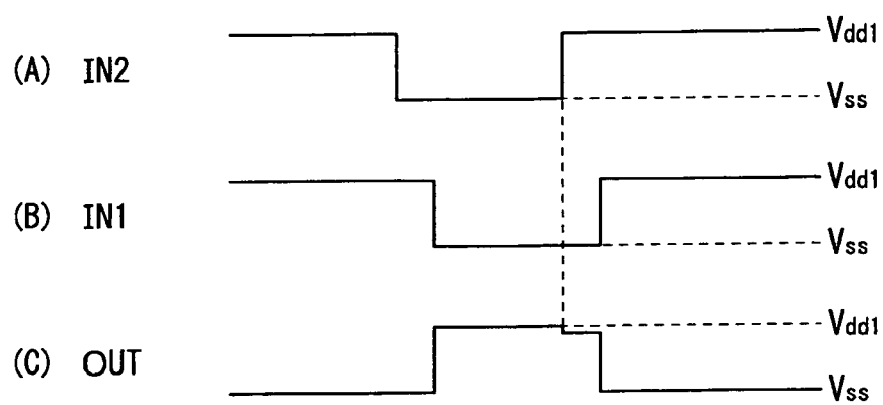
FIG. 2 is a waveform diagram illustrating an example of input-output signal waveforms of the inverter circuit in FIG. 1.

As described above, in the inverter circuit 1 of the present embodiment, the pulse signal (e.g., Part (C) of FIG. 2), whose signal waveform is almost the inverse of the signal waveform of the pulse signal (e.g., Part (B) of FIG. 2) input into the input terminal IN, is output from the output terminal OUT.

[Effect]

Figure 28:
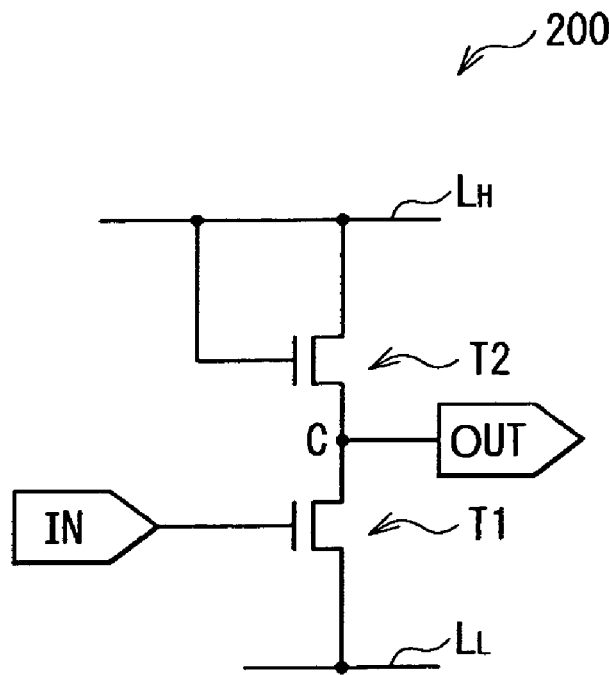
FIG. 28 is a circuit diagram illustrating an example of an inverter circuit in related art.
Figure 29:
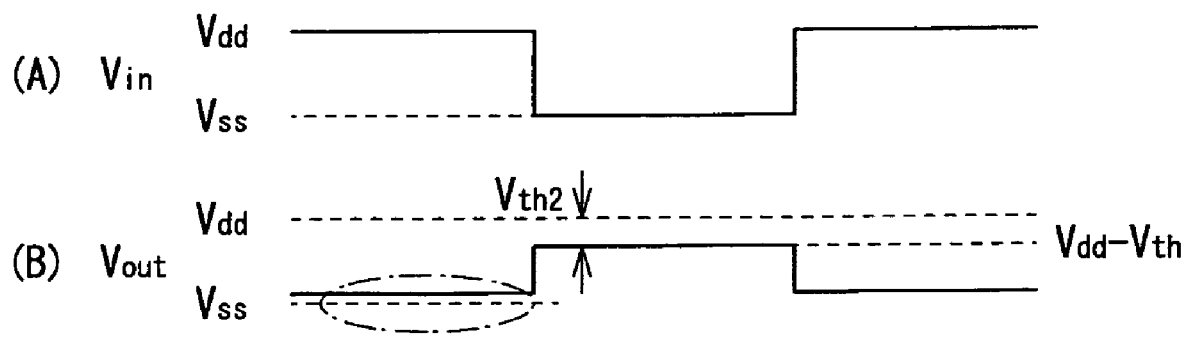
FIG. 29 is a waveform diagram illustrating an example of input-output signal waveforms of the inverter circuit in FIG. 28.
Figure 30:
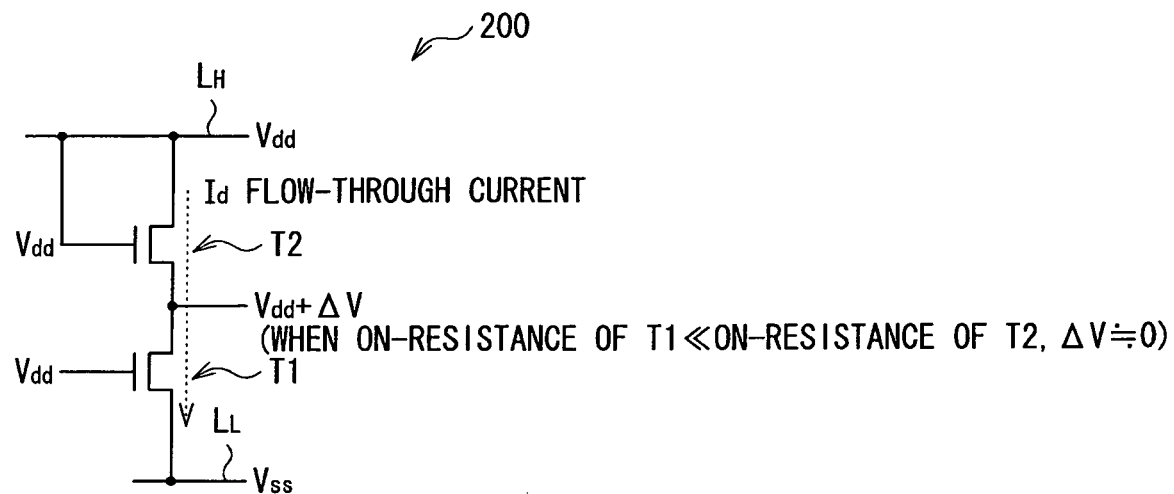
FIG. 30 is a circuit diagram for explaining an example of the operation of the inverter circuit in FIG. 28.
Figure 31:
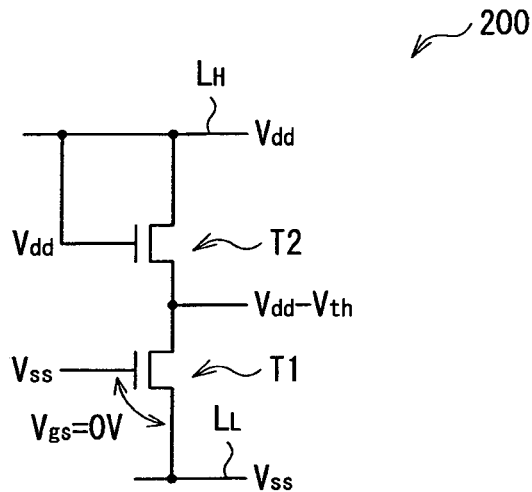
FIG. 31 is a circuit diagram for explaining an example of the operation following FIG. 30.

For example, the inverter circuit 200 as illustrated in FIG. 28 in related art has the single channel type of circuit configuration in which the two NMOS transistors T1 and T2 are connected in series. In the inverter circuit 200, for example, as illustrated in FIG. 29, when the input voltage Vin is Vss, the output voltage Vout is Vdd−Vth2 without being Vdd. In other words, the threshold voltage Vth2 of the transistor T2 is included in the output voltage Vout, and the output voltage Vout is greatly affected by the variations in the threshold voltage Vth2 of the transistor T2.

Thus, for example, a configuration as illustrated in FIG. 32 is conceivable. This makes it possible to reduce an influence of the variations of the threshold voltage Vth2 of the transistor T2 upon the output voltage Vout. Further, in the inverter circuit 400 illustrated in FIG. 33, an amount of coupling ΔVx input into the gate and the source of the transistor T5 is not affected by the parasitic capacitance (not illustrated) in the output stage and therefore, the voltage between the gate and the source of the transistor T5 is able to be made large. As a result, the inverter circuit 400 is made faster.

Next, there will be considered a case in which the transistor property, particularly, the threshold voltage of the transistor T5 in the inverter circuit 400 in FIG. 33 varies. When the input voltage Vin changes from high to low, there occurs a difference in voltage between the gate and the source of the transistor T5, and thereby the transistor T5 is turned on. At the time, the voltage between the gate and the source of the transistor T5 becomes a value of ΔV1−ΔV2 as illustrated in FIG. 33. The transistor T5 operates in a saturation region when being on and thus, a current flows in the transistor T5 by this value of ΔV1−ΔV2, and the gate voltage of the transistor T2 rises. At the time, a current Ids flowing through the transistor T5 becomes the following value. In the following expression, k is a constant number determined by the size of a transistor and a process. μ is mobility, and Vth5 is the threshold voltage of the transistor T5.

$$Ids = k\mu (\Delta V1 - \Delta V2 - Vth5)^2$$

As apparent from the above expression, Ids is affected by the threshold voltage Vth5 of the transistor T5. Therefore, when variations occur in the threshold voltage Vth5 of the transistor T5, variations also occur in the value of Ids, varying the rising speed of the gate voltage of the transistor T2. Thus, because of the variations in the threshold voltage Vth5 of the transistor T5, variations occur in the speed (transient) of the output voltage Vout. As a result, variations in the ON time of the transistor that uses the output voltage Vout as a control pulse occur, causing defects such as unevenness and lines in a display image.

On the other hand, in the inverter circuit 1 of the present embodiment, between the input terminal IN1 and the low voltage line $L_L$ as well as the high voltage line $L_{H1}$, the transistors T1 and T3 are provided. Further, between the input terminal IN2 and the low voltage line $L_L$, the transistors T4 and T6 are provided. On the other hand, between the high voltage line $L_{H1}$ and the output terminal OUT, the transistor T2 is provided, and between the high voltage line $L_{H2}$ and the gate of the transistor T2, the transistor T5 is provided. Furthermore, between the input terminal IN1 and the gate of the transistor T5, the capacitive elements C1 and C2 are inserted in series, and between the connection point between the capacitive elements C1 and C2 and the gate of the transistor T4, the capacitive element C3 is provided. Moreover, the connection point between the capacitive elements C1 and C2 is connected to the gate of the transistor T2. Therefore, there is almost no time period over which the transistor T1 and the transistor T2 are turned on at the same time, or the transistor T4 and the transistor T5 are turned on at the same time. As a result, through these transistors, a current (a through current) hardly flows between the voltage lines and thus, power consumption is able to be suppressed.

Furthermore, in the present embodiment, a pulse signal more advanced in phase than a pulse signal input into the input terminal IN1 is applied to the input terminal 1N2. As a result, when the voltage of the input terminal IN1 changes from high to low, an influence of the threshold voltage of the transistor T5 is removed from the voltage between the gate and the source of the transistor T5. Therefore, subsequently, when a current flows through the transistor T5 after the transistor T5 is turned on, the influence of the threshold voltage of the transistor T5 is also removed from the current value Ids. This makes it possible to reduce the variations of the output voltage Vout. As a result, it is possible to reduce variations in the ON time of the transistor which uses the output voltage Vout as a control pulse and therefore, for example, it is possible to reduce variations among the pixel circuits in terms of the threshold correction and the mobility correction of the drive transistor in the pixel circuit and besides, variations in luminance among the pixels are reduced.

<Modification>

Figure 15:
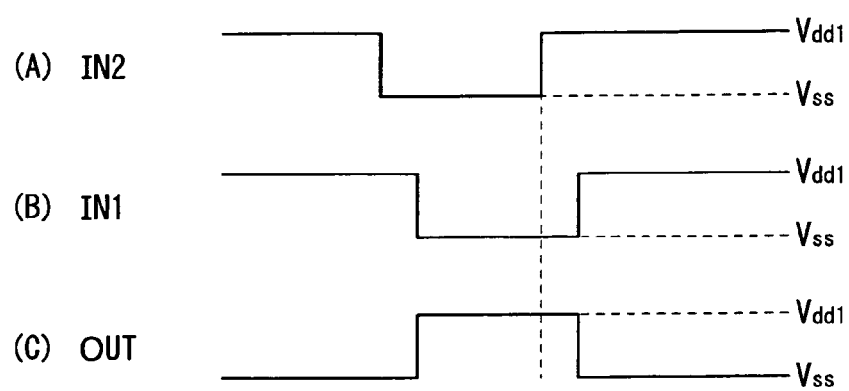
FIG. 15 is a waveform diagram illustrating an example of the operation of the inverter circuit in FIG. 14.
Figure 16:
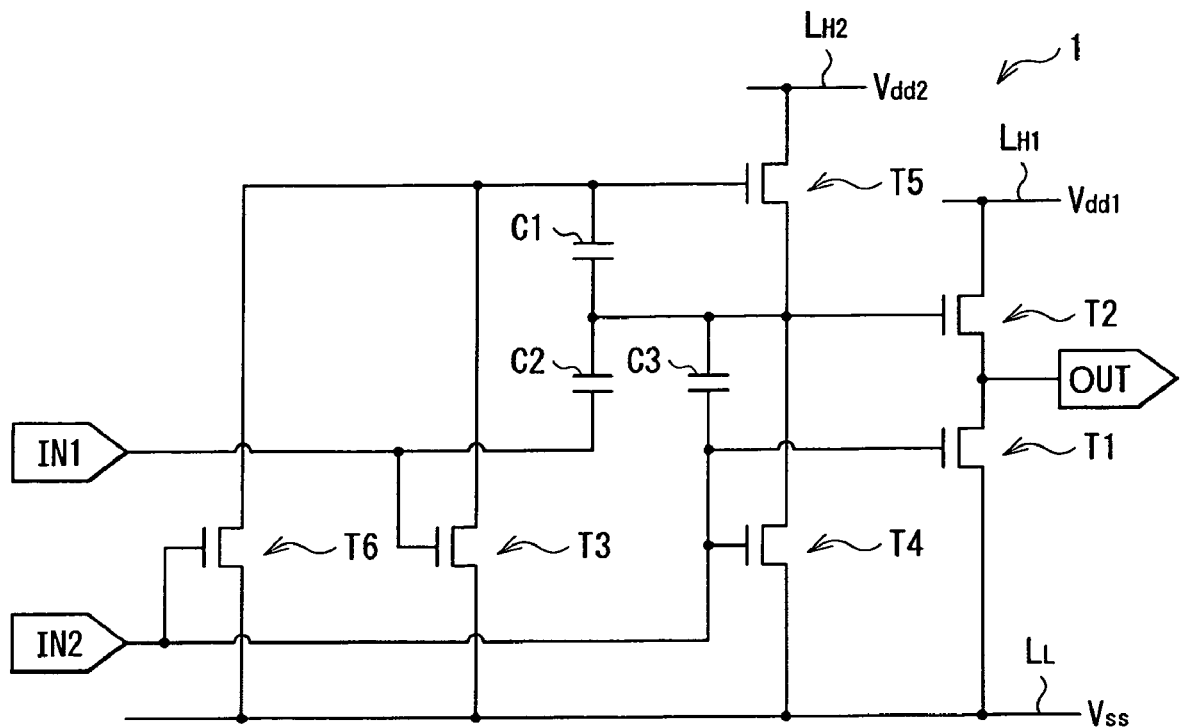
FIG. 16 is a circuit diagram illustrating a second modification of the inverter circuit in FIG. 1.

In the embodiment described above, for example, as illustrated in FIG. 14, a capacitive element C0 may be provided between the output terminal OUT and the low voltage line $L_L$. At the time, to the input terminals IN1 and IN2, for example, waveforms as illustrated in FIG. 15 are input. This capacitive element C0 has a capacity with a value larger than the parasitic capacitance of each of the transistors T1 to T6. The capacitive element C0 makes it possible to prevent a change in the gate voltage of the transistor T2 at the time of a rise in the input voltage Vint from being coupled to the output terminal OUT. As a result, it is possible to obtain inverter properties free from deterioration of the output voltage Vout.

Figure 17:
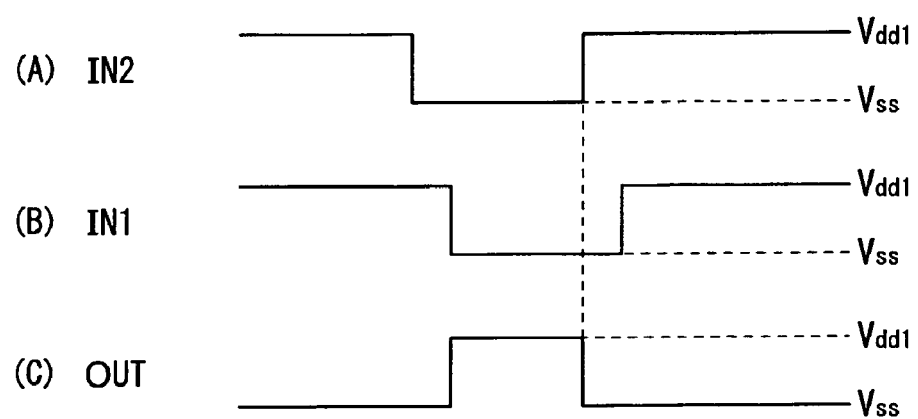
FIG. 17 is a waveform diagram illustrating an example of the operation of the inverter circuit in FIG. 16.
Figure 18:
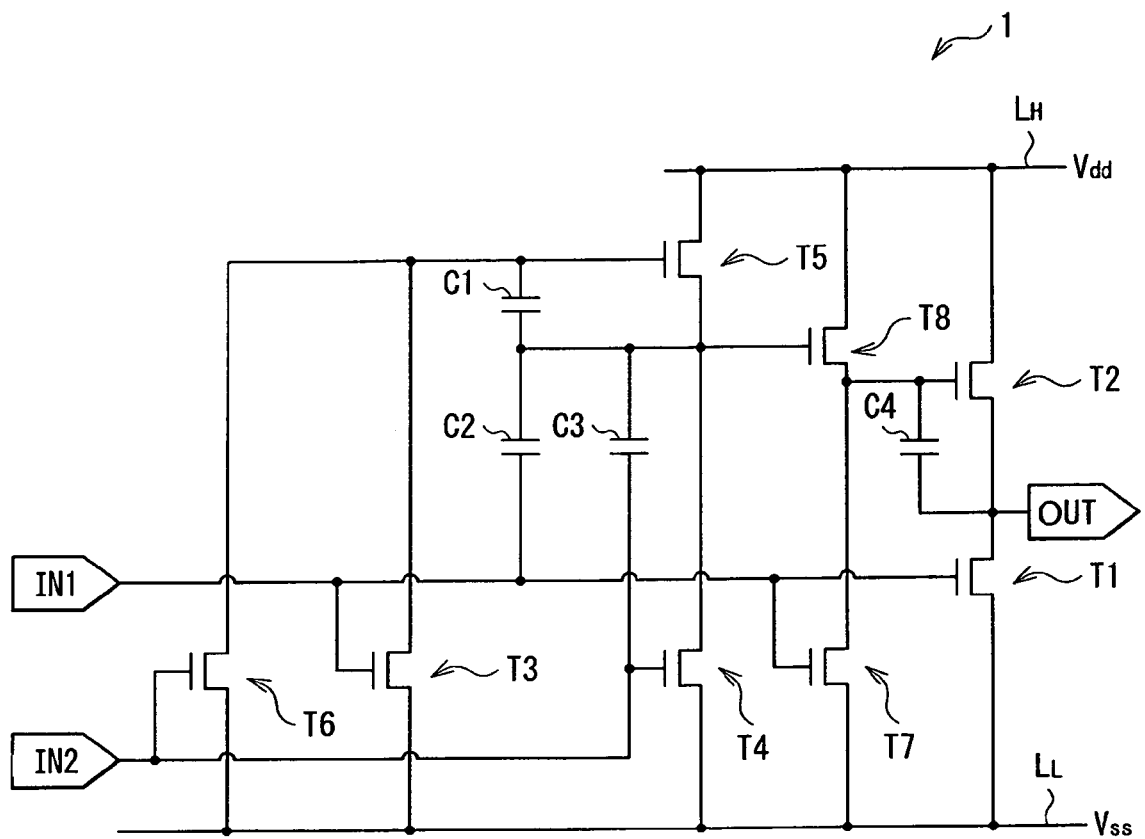
FIG. 18 is a circuit diagram illustrating a third modification of the inverter circuit in FIG. 1.

Further, in the embodiment described above, for example, as illustrated in FIG. 16, the gate of the transistor T1 may be connected to the input terminal IN2. At the time, to the input terminals IN1 and IN2, for example, waveforms as illustrated in FIG. 17 are input. In this case, it is possible to obtain an NOR output based on an input terminal VIN1 and an input terminal VIN2 and also, the deterioration of the output voltage Vout is prevented.

Figure 19:
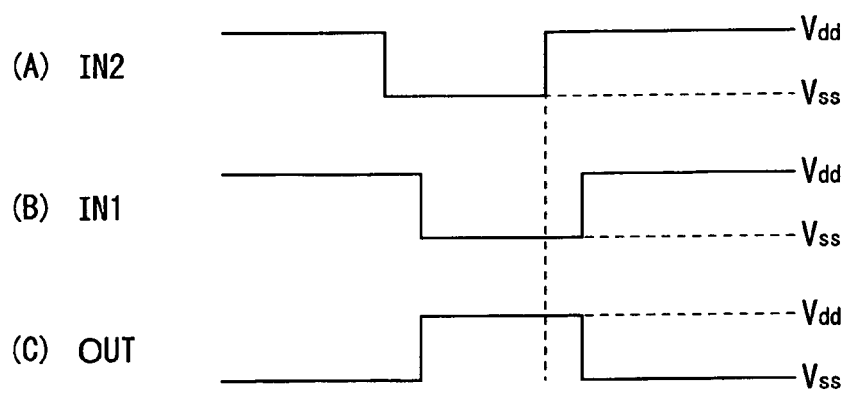
FIG. 19 is a waveform diagram illustrating an example of the operation of the inverter circuit in FIG. 14.

Furthermore, in the embodiment described above, for example, as illustrated in FIG. 18, between the transistors T1 and T2 in the output stage and the transistors T4 and T5 in a middle stage, transistors T7 and T8 may be provided and further, a capacitive element C4 may be provided between the gate and the source of the transistor T2. At the time, to the input terminals IN1 and 1N2, for example, waveforms as illustrated in FIG. 19 are input. In this case, it is possible to provide a single voltage line on each of the high voltage side and the low voltage side. This makes it possible, for example, to eliminate a reduction in yields resulting from withstand voltage. Although not illustrated, in the inverter circuit illustrated in FIG. 18, the capacitive element C0 illustrated in FIG. 14 may be provided between the output terminal OUT and the low voltage line $L_L$. In addition, although not illustrated, in the circuit in FIG. 18, the gates of the transistors T1 and T3 may be connected to the input terminal 1N2.

Further, in the embodiment described above, for example, as illustrated in FIG. 20, in the inverter circuit 1 of FIG. 1, the transistors Ti and T2 may be removed, and the output terminal OUT may be connected to the connection point between the transistor T4 and the transistor T5. At the time, for example, waveforms as illustrated in FIG. 21 are input into the input terminals IN1 and IN2. In this case, it is possible to obtain effects similar to those of the inverter circuit 1 in the embodiment described above, with a smaller number of elements. Incidentally, as illustrated in FIG. 21, there is a time period over which the output voltage Vout drops to a voltage lower than Vss, but this period is the time of a phase difference between the input voltage Vin1 and the input voltage Vin2 and is made extremely short and thus poses no shortcoming.

Figure 20:
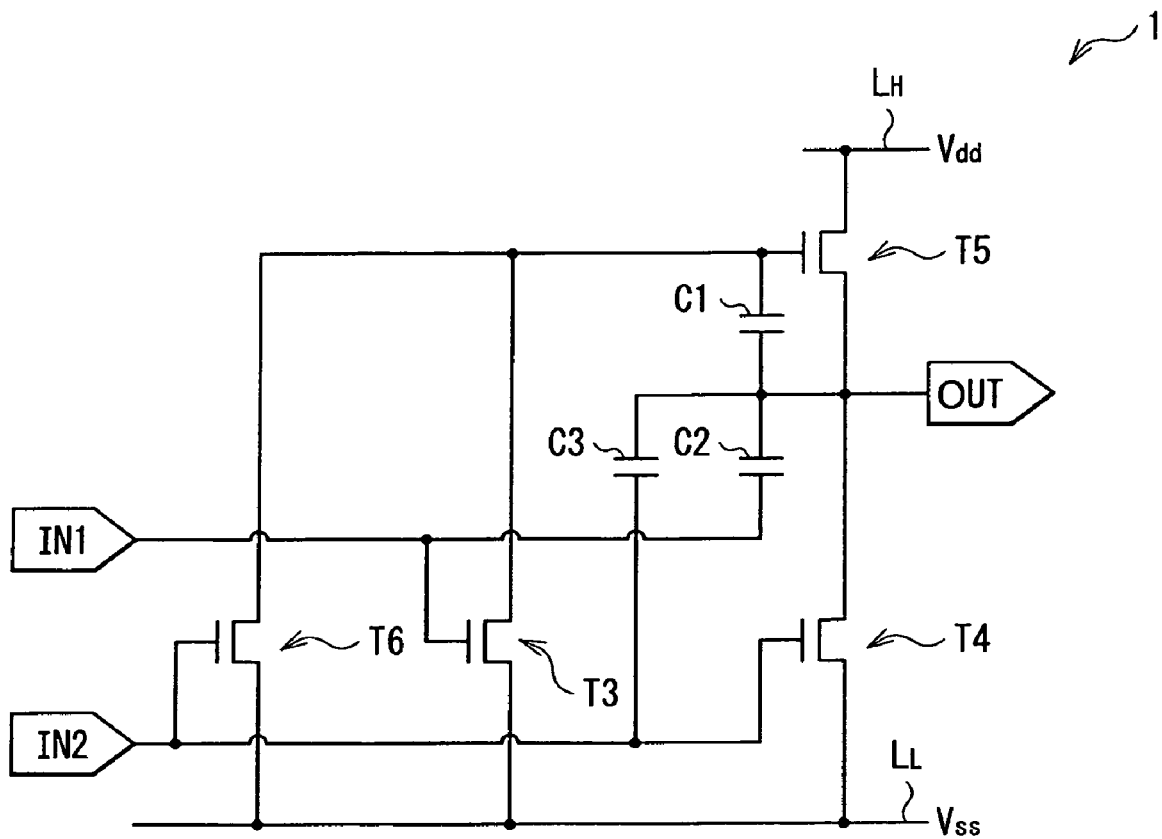
FIG. 20 is a circuit diagram illustrating a fourth modification of the inverter circuit in FIG. 1.
Figure 21:
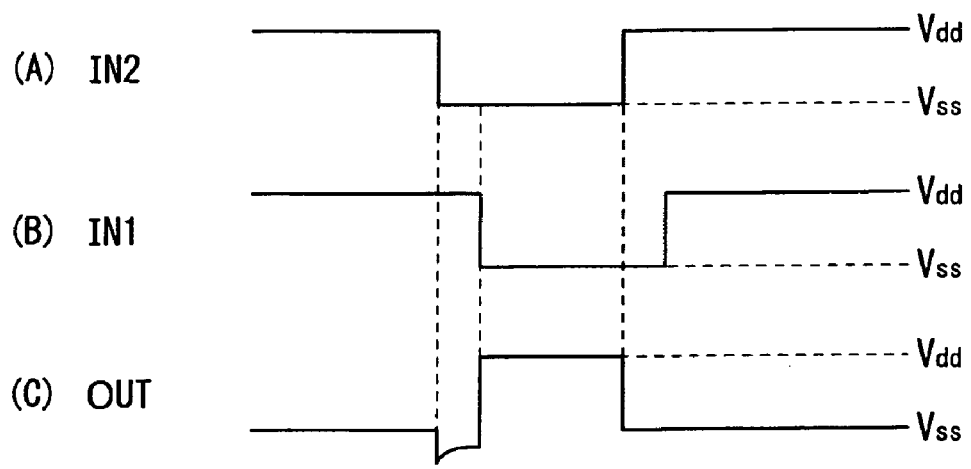
FIG. 21 is a waveform diagram illustrating an example of input-output signal waveforms of the inverter circuit in FIG. 20.
Figure 22:
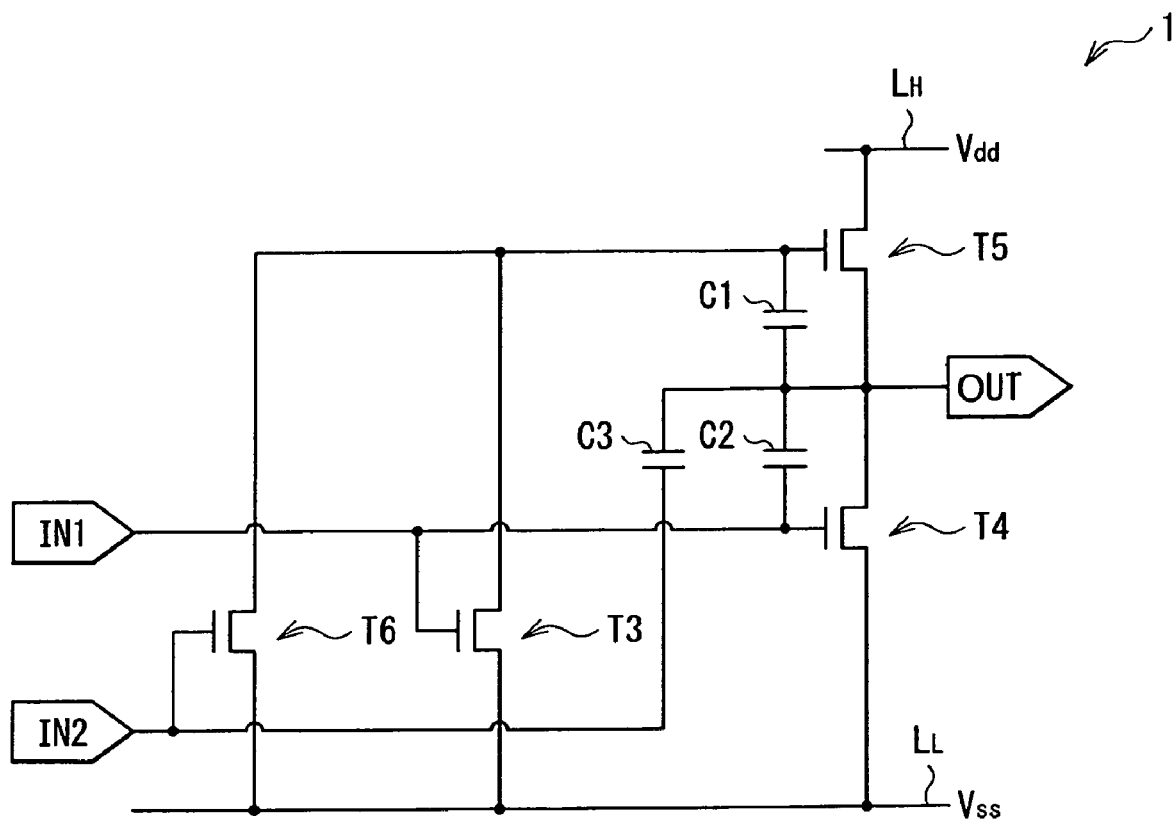
FIG. 22 is a circuit diagram illustrating a fifth modification of the inverter circuit in FIG. 1.
Figure 23:
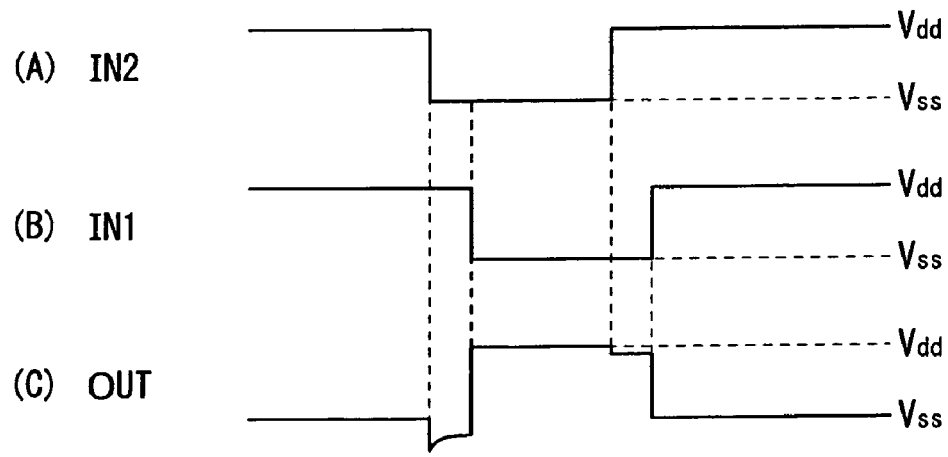
FIG. 23 is a waveform diagram illustrating an example of input-output signal waveforms of the inverter circuit in FIG. 22.

Furthermore, for example, as illustrated in FIG. 22, in the inverter circuit 1 illustrated in FIG. 20, the gate of the transistor T4 may be separated from the input terminal IN2 and connected to the input terminal IN1. At the time, for example, waveforms illustrated in FIG. 23 are input into the input terminals IN1 and IN2. In this case, also, it is possible to obtain effects similar to those of the inverter circuit in the embodiment described above, with a smaller number of elements. Incidentally, as illustrated in FIG. 23, there is a time period over which the output voltage Vout drops to a voltage lower than Vss, but this period is the time of a phase difference between the input voltage Vin1 and the input voltage Vin2 and is made extremely short and thus poses no shortcoming.

Further, in the embodiment and the modifications described above, the transistors T1 to T6 are formed by the n-channel MOS TFTs, but may be formed by p-channel MOS TFTs, for example.

<Application Example>

Figure 24:
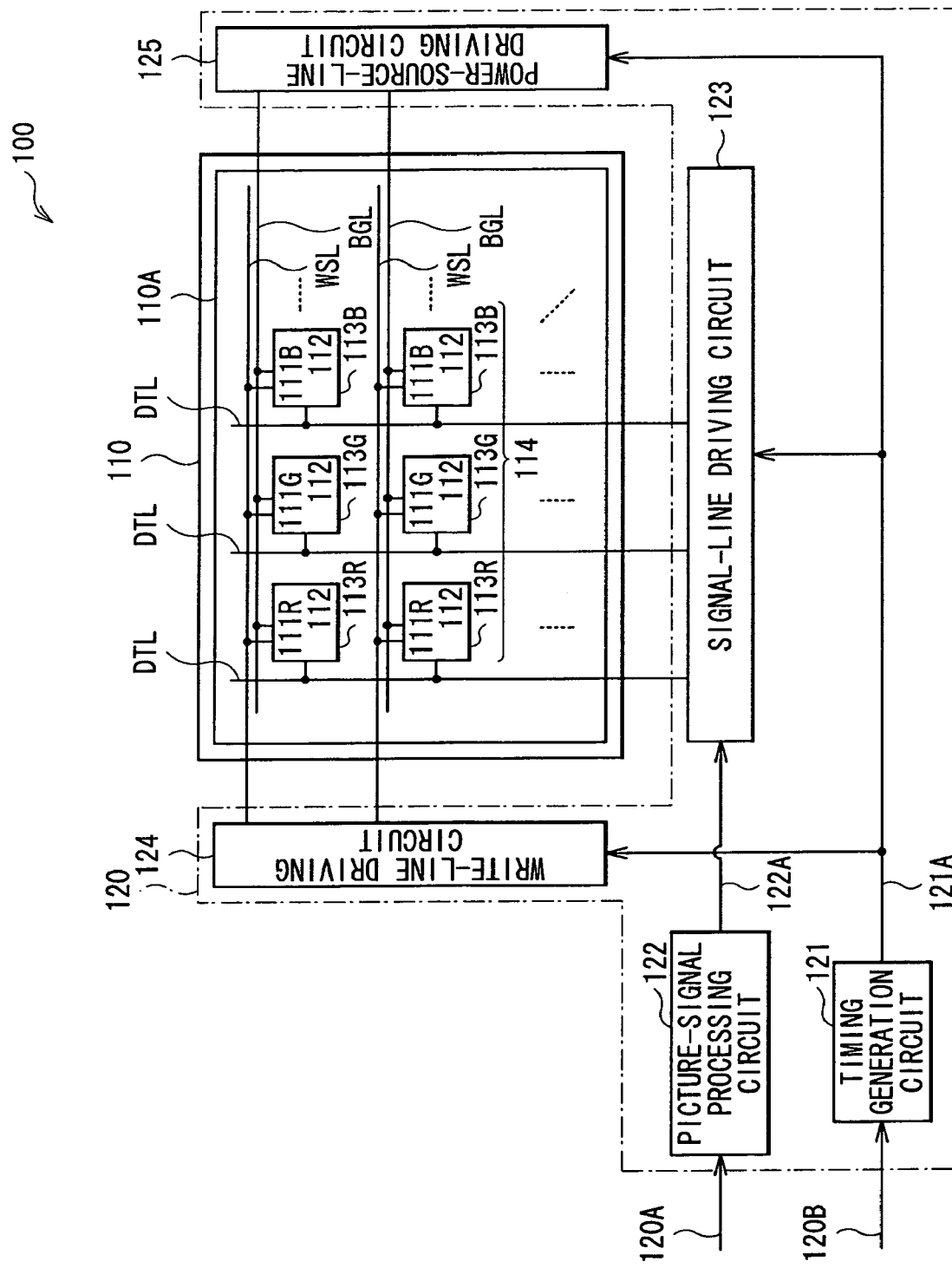
FIG. 24 is a schematic configuration diagram of a display device that is one of application examples of the inverter circuit in the present embodiment and its modifications.

FIG. 24 illustrates an example of the entire configuration of a display device 100 that is one of application examples of the inverter circuit 1 according to each of the above-described embodiment and the modifications. This display device 100 includes, for example, a display panel 110 (display section) and a driving circuit 120 (drive section).

(Display Panel 110)

The display panel 110 includes a display area 110A in which three kinds of organic EL elements 111R, 111G and 111B emitting mutually different colors are arranged two-dimensionally. The display area 110A is an area that displays an image by using light emitted from the organic EL elements 111R, 111G and 111B. The organic EL element 111R is an organic EL element that emits red light, the organic EL element 111G is an organic EL element that emits green light, and the organic EL element 111B is an organic EL element that emits blue light. Incidentally, in the following, the organic EL elements 111R, 111G and 111B will be collectively referred to as an organic EL element 111 as appropriate.

(Display Area 110A)

Figure 25:
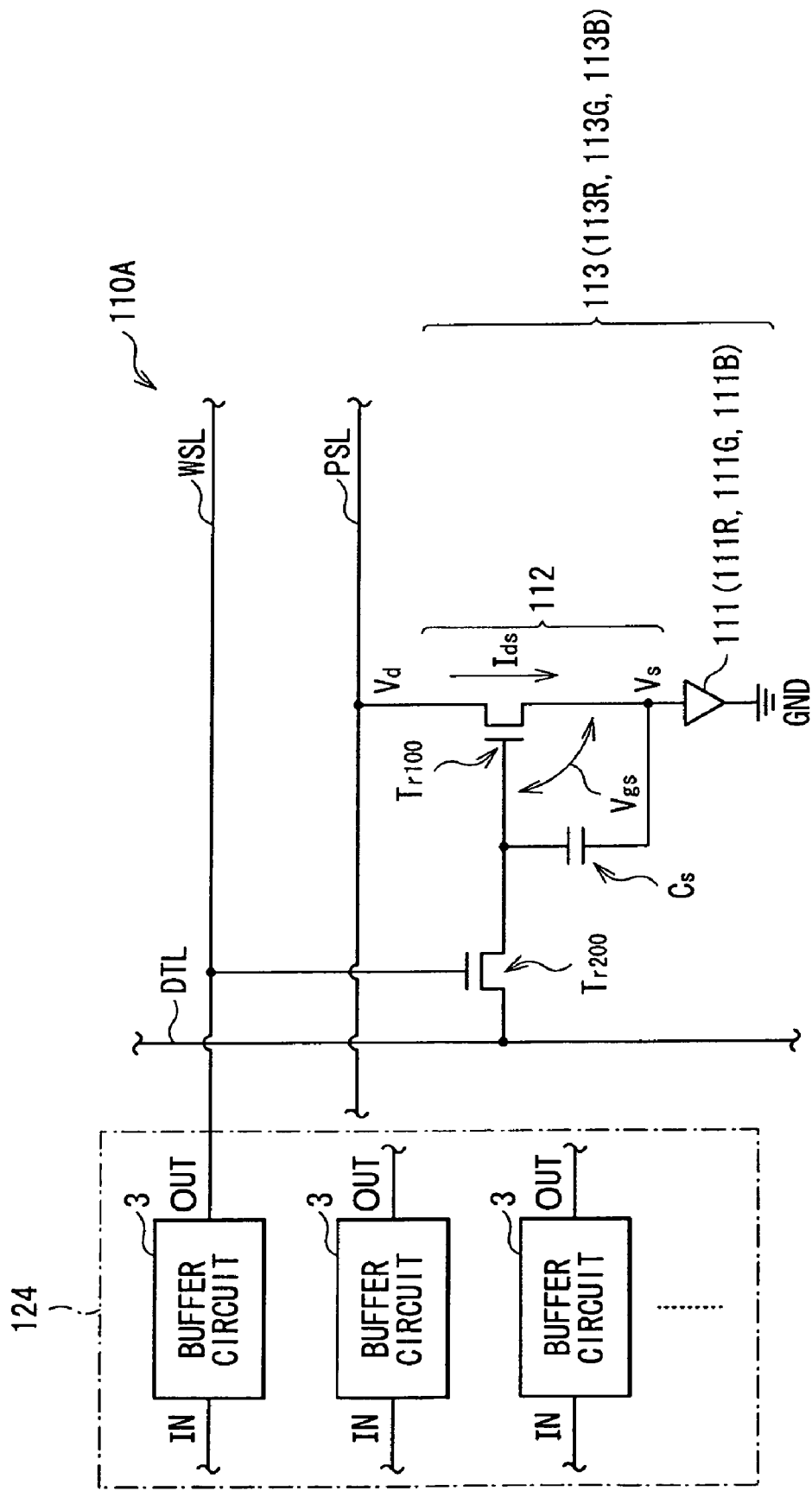
FIG. 25 is a circuit diagram illustrating an example of a write-line driving circuit and an example of a pixel circuit in FIG. 24.

FIG. 25 illustrates an example of a circuit configuration within the display area 110A, together with an example of a write-line driving circuit 124 to be described later. Within the display area 110A, plural pixel circuits 112 respectively paired with the individual organic EL elements 111 are arranged two-dimensionally. In the present application example, a pair of the organic EL element 111 and the pixel circuit 112 configure one pixel 113. To be more specific, as illustrated in FIG. 24, a pair of the organic EL element 111R and the pixel circuit 112 configure one pixel 113R for red, a pair of the organic EL element 111G and the pixel circuit 112 configure one pixel 113G for green, and a pair of the organic EL element 111 B and the pixel circuit 112 configure one pixel 113B for blue. Further, the adjacent three pixels 113R, 113G and 113B configure one display pixel 114.

Each of the pixel circuits 112 includes, for example, a drive transistor $Tr_{100}$ that controls a current flowing in the organic EL element 111, a write transistor $Tr_{200}$ that writes a voltage of a signal line DTL into the drive transistor $Tr_{100}$, and a retention capacitor $C_s$, and thus each of the pixel circuits 112 has a 2Tr1C circuit configuration. The drive transistor $Tr_{100}$ and the write transistor $Tr_{200}$ are each formed by, for example, an n-channel MOS Thin Film Transistor (TFT). The drive transistor $Tr_{100}$ or the write transistor $Tr_{200}$ may be, for example, a p-channel MOS TFT.

In the display area 110A, plural write lines WSL (scanning line) are arranged in rows and plural signal lines DTL are arranged in columns. In the display area 110A, further, plural power-source lines PSL (member to which the source voltage is supplied) are arranged in rows along the write lines WSL. Near a cross-point between each signal line DTL and each write line WSL, one organic EL element 111 is provided. Each of the signal lines DTL is connected to an output end (not illustrated) of a signal-line driving circuit 123 to be described later, and to either of the drain electrode and the source electrode (not illustrated) of the write transistor $Tr_{200}$. Each of the write lines WSL is connected to an output end (not illustrated) of the write-line driving circuit 124 to be described later and to the gate electrode (not illustrated) of the write transistor $Tr_{200}$. Each of the power-source lines PSL is connected to an output end (not illustrated) of a power-source-line driving circuit 125 to be described later, and to either of the drain electrode and the source electrode (not illustrated) of the drive transistor $Tr_{100}$. Of the drain electrode and the source electrode of the write transistor $Tr_{200}$, one (not illustrated) that is not connected to the signal line DTL is connected to the gate electrode (not illustrated) of the drive transistor $Tr_{100}$ and one end of the retention capacitor $C_s$. Of the drain electrode and the source electrode of the drive transistor $Tr_{100}$, one (not illustrated) that is not connected to the power-source line PSL and the other end of the retention capacitor $C_s$ are connected to an anode electrode (not illustrated) of the organic EL element 111. A cathode electrode (not illustrated) of the organic EL element 111 is connected to, for example, a ground line GND.

(Drive Circuit 120)

Next, each circuit within the drive circuit 120 will be described with reference to FIG. 24 and FIG. 25. The drive circuit 120 includes a timing generation circuit 121, a picture signal processing circuit 122, the signal-line driving circuit 123, the write-line driving circuit 124 and the power-source-line driving circuit 125.

The timing generation circuit 121 performs control so that the picture signal processing circuit 122, the signal-line driving circuit 123, the write-line driving circuit 124 and the power-source-line driving circuit 125 operate in an interlocking manner. For example, the timing generation circuit 121 is configured to output a control signal 121A to each of the above-described circuits, according to (in synchronization with) a synchronization signal 120B input externally.

The picture signal processing circuit 122 makes a predetermined correction to a picture signal 120A input externally, and outputs to the signal-line driving circuit 123 a picture signal 122A after the correction. As the predetermined correction, there are, for example, a gamma correction and an overdrive correction.

The signal-line driving circuit 123 applies, according to (in synchronization with) the input of the control signal 121A, the picture signal 122A (signal voltage $V_{sig}$) input from the picture signal processing circuit 122, to each of the signal lines DTL, thereby performing writing into the pixel 113 targeted for selection. Incidentally, the writing refers to the application of a predetermined voltage to the gate of the drive transistor $Tr_{100}$.

The signal-line driving circuit 123 is configured to include, for example, a shift resistor (not illustrated), and includes a buffer circuit (not illustrated) for each stage, corresponding to each column of the pixels 113. This signal-line driving circuit 123 is able to output two kinds of voltages ($V_{ofs}$, $V_{sig}$) to each of the signal lines DTL, according to (in synchronization with) the input of the control signal 121A. Specifically, the signal-line driving circuit 123 supplies, via the signal line DTL connected to each of the pixels 113, the two kinds of voltages ($V_{ofs}$, $V_{sig}$) sequentially to the pixel 113 selected by the write-line driving circuit 124.

Here, the offset voltage $V_{ofs}$ is a constant voltage value without relying on the signal voltage $V_{sig}$. Further, the signal voltage $V_{sig}$ is a value corresponding to the picture signal 122A. A minimum voltage of the signal voltage $V_{sig}$ is a value lower than the offset voltage $V_{ofs}$, and a maximum voltage of the signal voltage $V_{sig}$ is a value higher than the offset voltage $V_{ofs}$.

The write-line driving circuit 124 is configured to include, for example, a shift resistor (not illustrated), and includes a buffer circuit 3 for each stage, corresponding to each row of the pixels 113. The buffer circuit 3 is configured to include plural inverter circuits 1 described above, and outputs, from an output end, a pulse signal approximately in the same phase as a pulse signal input into an input end. The write-line driving circuit 124 outputs two kinds of voltages ($V_{ddl}$, $V_{ss}$) to each of the write lines WSL, according to (in synchronization with) the input of the control signal 121A. Specifically, the write-line driving circuit 124 supplies, via the write line WSL connected to each of the pixels 113, the two kinds of voltages ($V_{ddl}$, $V_{ss}$) to the pixel 113 targeted for driving, and thereby controls the write transistor $Tr_{200}$.

Here, the voltage $V_{ddl}$ is a value equal to or higher than an on-voltage of the write transistor $Tr_{200}$. $V_{ddl}$ is the value of a voltage output from the write-line driving circuit 124 at the time of extinction or at the time of a threshold correction to be described later. $V_{ss}$ is a value lower than the on-voltage of the write transistor $Tr_{200}$, and also lower than $V_{ddl}$.

The power-source-line driving circuit 125 is configured to include, for example, a shift resistor (not illustrated), and includes, for example, a buffer circuit (not illustrated) for each stage, corresponding to each row of the pixels 113. This power-source-line driving circuit 125 outputs two kinds of voltages ($V_{ccH}$, $V_{ccL}$) according to (in synchronization with) the input of the control signal 121A. Specifically, the power-source-line driving circuit 125 supplies, via the power-source line PSL connected to each of the pixels 113, the two kinds of voltages ($V_{ccH}$, $V_{ccL}$) to the pixel 113 targeted for driving, and thereby controls the light emission and extinction of the organic EL element 111.

Here, the voltage $V_{ccL}$ is a value lower than a voltage ($V_{el}+V_{ca}$) that is the sum of a threshold voltage $V_{el}$ of the organic EL element 111 and a voltage $V_{ca}$ of the cathode of the organic EL element 111. Further, the voltage $V_{ccH}$ is a value equal to or higher than the voltage ($V_{el}+V_{ca}$).

Next, an example of the operation (operation from extinction to light emission) of the display device 100 according to the present application example will be described. In the present application example, in order that even when the threshold voltage $V_{th}$ and the mobility μ of the drive transistor $Tr_{100}$ change over time, light emission luminance of the organic EL element 111 remains constant without being affected by these changes, correction operation for the change of the threshold voltage $V_{th}$ and the mobility μ is incorporated.

Figure 26:
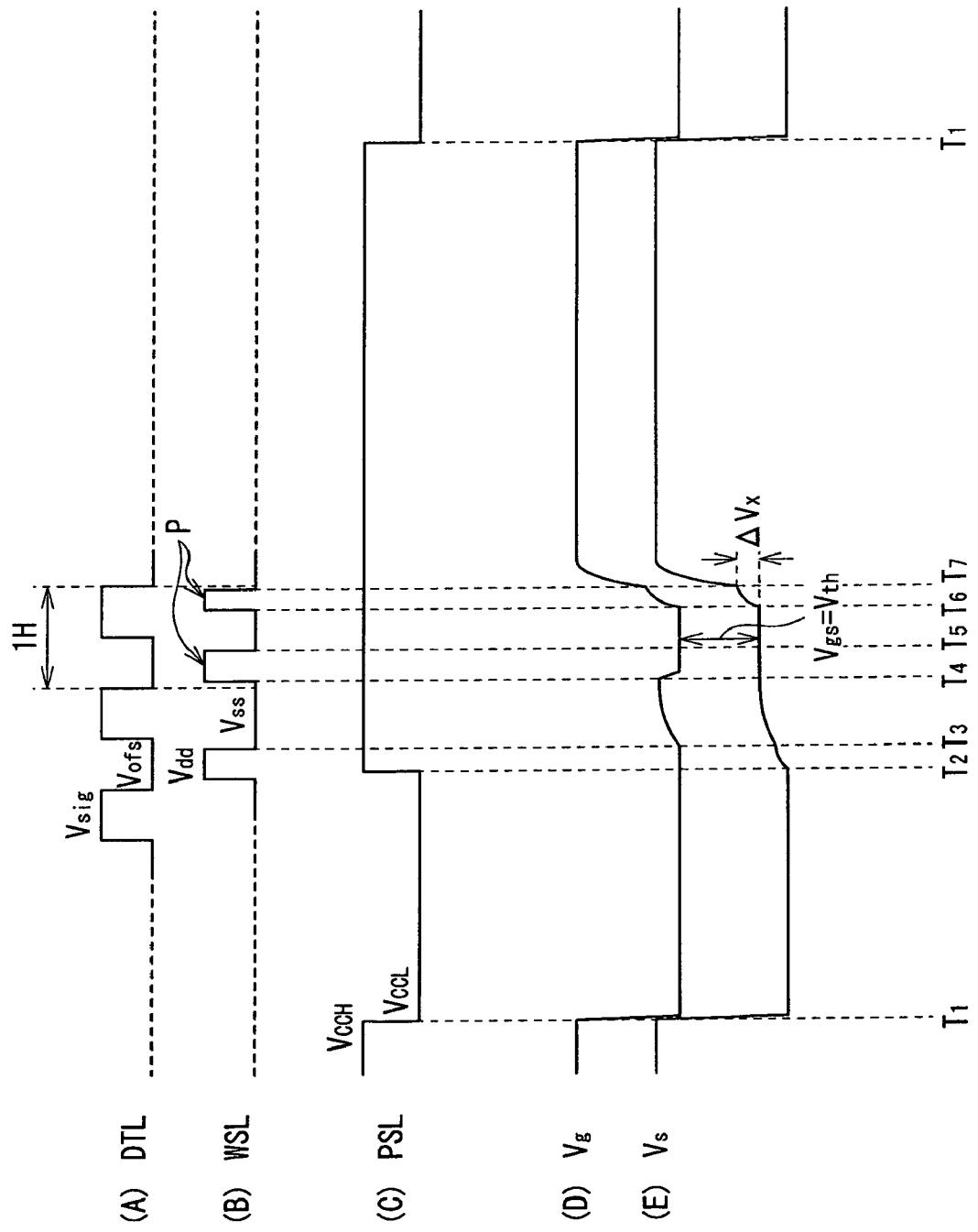
FIG. 26 is a waveform diagram illustrating an example of the operation of the display device in FIG. 24.
Figure 27:
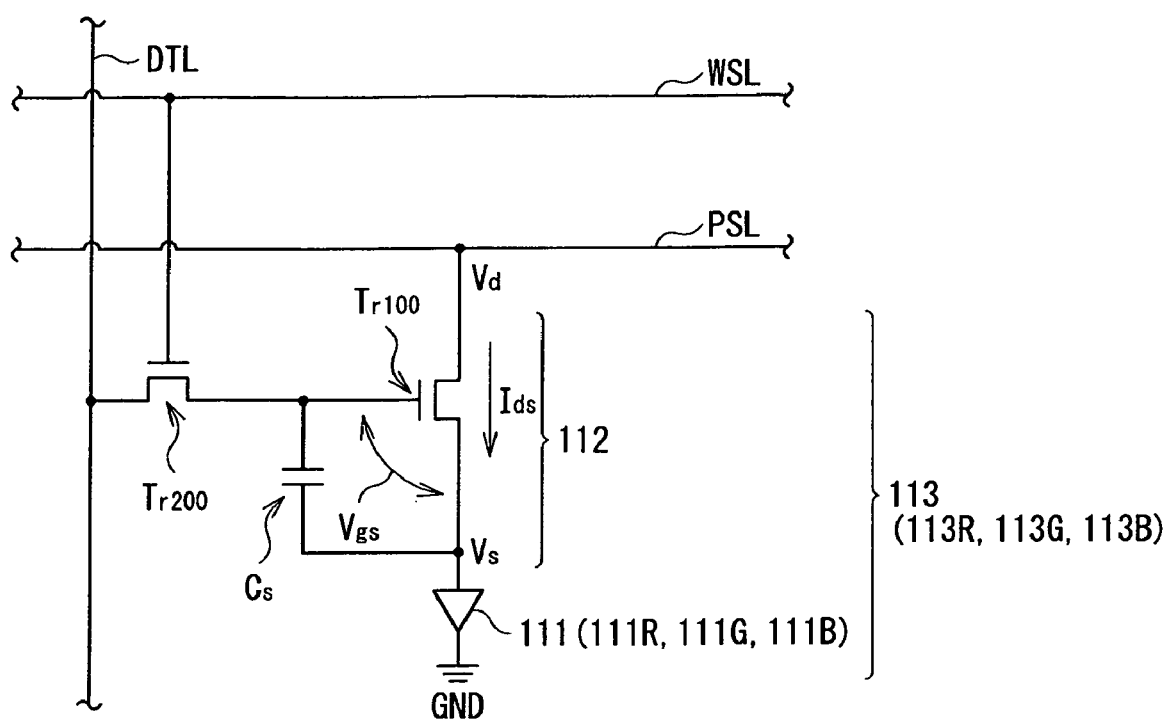
FIG. 27 is a circuit diagram illustrating an example of a pixel circuit in a display device in related art.

FIG. 26 illustrates an example of the waveform of a voltage applied to the pixel circuit 112 and an example of the change in each of the gate voltage $V_g$ and the source voltage $V_s$ of the drive transistor $Tr_{100}$. In Part (A) of FIG. 26, there is illustrated a state in which the signal voltage $V_{sig}$ and the offset voltage $V_{ofs}$ are applied to the signal line DTL. In Part (B) of FIG. 26, there is illustrated a state in which the voltage $V_{dd}$ for turning on the write transistor $Tr_{200}$ and the voltage $V_{ss}$ for turning off the write transistor $Tr_{200}$ are applied to the write line WSL. In Part (C) of FIG. 26, there is illustrated a state in which the voltage $V_{ccH}$ and the voltage $V_{ccL}$ are applied to the power-source line PSL. Further, in Part (D) and Part (E) of FIG. 26, there is illustrated a state in which the gate voltage $V_g$ and the source voltage $V_s$ of the drive transistor $Tr_{100}$ change over time in response to the application of the voltages to the power-source line PSL, the signal line DTL and the write line WSL.

($V_{th}$ Correction Preparation Period)

First, a preparation for the $V_{th}$ correction is made. Specifically, when the voltage of the write line WSL is $V_{off}$, and the voltage of the power-source line PSL is $V_{ccH}$ (in other words, when the organic EL element 111 is emitting light), the power-source-line driving circuit 125 reduces the voltage of the power-source line PSL from $V_{ccH}$ to $V_{ccL}$ ($T_1$). Then, the source voltage $V_s$ becomes $V_{ccL}$, and the organic EL element 111 stops emitting the light. Subsequently, when the voltage of the signal line DTL is $V_{ofs}$, the write-line driving circuit 124 increases the voltage of the write line WSL from $V_{off}$ to $V_{on}$, so that the gate of the drive transistor $Tr_{100}$ becomes $V_{ofs}$.

[0086] (First $V_{th}$ correction period)

Next, the correction of $V_{th}$ is performed. Specifically, while the write transistor $Tr_{200}$ is on, and the voltage of the signal line DTL is $V_{ofs}$, the power-source-line driving circuit 125 increases the voltage of the power-source line PSL from $V_{ccL}$ to $V_{ccH}$ ($T_2$). Then, a current $I_{ds}$ flows between the drain and the source of the drive transistor $Tr_{100}$, and the source voltage $V_s$ rises. Subsequently, before the signal-line driving circuit 123 switches the voltage of the signal line DTL from $V_{ofs}$ to $V_{sig}$, the write-line driving circuit 124 reduces the voltage of the write line WSL from $V_{on}$ to $V_{off}$ ($T_3$). Then, the gate of the drive transistor $Tr_{100}$ enters a floating state, and the correction of $V_{th}$ stops.

(First $V_{th}$ Correction Stop Period)

In a period during which the $V_{th}$ correction is stopped, in, for example, other row (pixel) different from the row (pixel) to which the previous correction is made, the voltage of the signal line DTL is sampled. At the time, in the row (pixel) to which the previous correction is made, the source voltage $V_s$ is lower than $V_{ofs}-V_{th}$. Therefore, also during the $V_{th}$ correction stop period, in the row (pixel) to which the previous correction is made, the current $I_{ds}$ flows between the drain and the source of the drive transistor $Tr_{100}$, the source voltage $V_s$ rises, and the gate voltage $V_g$ also rises due to coupling via the retention capacitor $C_s$.

(Second $V_{th}$ Correction Period)

Next, the $V_{th}$ correction is made again. Specifically, when the voltage of the signal line DTL is $V_{ofs}$ and the $V_{th}$ correction is possible, the write-line driving circuit 124 increases the voltage of the write line WSL from $V_{off}$ to $V_{on}$, thereby causing the gate of the drive transistor $Tr_{100}$ to be $V_{ofs}$ ($T_4$). At the time, when the source voltage $V_s$ is lower than $V_{ofs}-V_{th}$ (when the $V_{th}$ correction is not completed yet), the current $I_{ds}$ flows between the drain and the source of the drive transistor $Tr_{100}$, until the drive transistor $Tr_{100}$ is broken (until a between-gate-and-source voltage $V_{gs}$ becomes $V_{th}$). Subsequently, before the signal-line driving circuit 123 switches the voltage of the signal line DTL from $V_{ofs}$ to $V_{sig}$, the write-line driving circuit 124 reduces the voltage of the write line WSL from $V_{on}$ to $V_{off}$ ($T_5$). Then, the gate of the drive transistor $Tr_{100}$ enters a floating state and thus, it is possible to keep the between-gate-and-source voltage $V_{gs}$ constant, regardless of the magnitude of the voltage of the signal line DTL.

Incidentally, during this $V_{th}$ correction period, when the retention capacitor $C_s$ is charged to $V_{th}$, and the between-gate-and-source voltage $V_{gs}$ becomes $V_{th}$, the drive circuit 120 finishes the $V_{th}$ correction. However, when the between-gate-and-source voltage $V_{gs}$ does not reach $V_{th}$, the drive circuit 120 repeats the $V_{th}$ correction and the $V_{th}$ correction stop, until the between-gate-and-source voltage $V_{gs}$ reaches $V_{th}$.

(Writing and μ Correction Period)

After the $V_{th}$ correction stop period ends, the writing and the μ correction are performed. Specifically, while the voltage of the signal line DTL is $V_{sig}$, the write-line driving circuit 124 increases the voltage of the write line WSL from $V_{off}$ to $V_{on}$ ($T_6$), and connects the gate of the drive transistor $Tr_{100}$ to the signal line DTL. Then, the gate voltage $V_g$ of the drive transistor $Tr_{100}$ becomes the voltage $V_{sig}$ of the signal line DTL. At the time, an anode voltage of the organic EL element 111 is still smaller than the threshold voltage $V_{el}$ of the organic EL element 111 at this stage, and the organic EL element 111 is broken. Therefore, the current $I_{ds}$ flows in an element capacitance (not illustrated) of the organic EL element 111 and thereby the element capacitance is charged and thus, the source voltage $V_s$ rises by $\Delta V_y$, and the between-gate-and-source voltage $V_{gs}$ soon becomes $V_{sig}+V_{th}-\Delta V_y$. In this way, the μ correction is performed concurrently with the writing. Here, the larger the mobility μ of the drive transistor $Tr_{100}$ is, the larger $\Delta V_y$ is. Therefore, by reducing the between-gate-and-source voltage $V_{gs}$ by $\Delta V_y$ before light emission, variations in the mobility μ among the pixels 113 are removed.

(Light Emission Period)

Lastly, the write-line driving circuit 124 reduces the voltage of the write line WSL from $V_{on}$ to $V_{off}$ ($T_7$). Then, the gate of the drive transistor $Tr_{100}$ enters a floating state, the current $I_{ds}$ flows between the drain and the source of the drive transistor $Tr_{100}$, and the source voltage $V_s$ rises. As a result, a voltage equal to or higher than the threshold voltage $V_{el}$ is applied to the organic EL element 111, and the organic EL element 111 emits light of desired luminance.

In the display device 100 of the present application example, as described above, the pixel circuit 112 is subjected to on-off control in each pixel 113, and the driving current is fed into the organic EL element 111 of each pixel 113, so that holes and electrons recombine and thereby emission of light occurs, and this light is extracted to the outside. As a result, an image is displayed in the display area 110A of the display panel 110.

Incidentally, in the present application example, for example, the buffer circuit 3 in the write-line driving circuit 124 is configured to include the plural inverter circuits 1. Therefore, there is almost no through current that flows in the buffer circuit 3 and thus, the power consumption of the buffer circuit 3 may be suppressed. In addition, since there are few variations in the output voltages of the buffer circuits 3, it is possible to reduce the variations among the pixel circuits 112, in terms of the threshold correction and the mobility correction of the drive transistor $Tr_{100}$ within the pixel circuit 112, and moreover, variations in luminance among the pixels 113 is reduced.

The present invention has been described by using the embodiment, the modifications and the application example, but the present invention is not limited to the embodiment and like and may be variously modified.

For example, in the above-described application example, the inverter circuit 1 according to the above-described embodiment is used in the output stage of the write-line driving circuit 124. However, the inverter circuit 1 may be used in an output stage of the power-source-line driving circuit 125, instead of being used in the output stage of the write-line driving circuit 124, or may be used in the output stage of the power-source-line driving circuit 125 in conjunction with the output stage of the write-line driving circuit 124.

The present application contains subject matter related to that disclosed in Japanese Priority Patent Application JP 2010-085511 filed in the Japan Patent Office on Apr. 1, 2010. the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An inverter circuit comprising:
a first transistor, a second transistor, a third transistor, a fourth transistor, a fifth transistor and a sixth transistor each having channels of same conduction type;
a first capacitive element, a second capacitive element and a third capacitive element; and
a first input terminal, a second input terminal and an output terminal,
wherein the first transistor makes or breaks electric connection between the output terminal and a first voltage line in response to a potential difference between a voltage of the first input terminal and a voltage of the first voltage line or a potential difference corresponding thereto,
the second transistor makes or breaks electric connection between a second voltage line and the output terminal in response to a potential difference between a voltage of a first terminal and a voltage of the output terminal or a potential difference corresponding thereto, the first terminal being a source or a drain of the fifth transistor,
the third transistor makes or breaks electric connection between a gate of the fifth transistor and the third voltage line in response to a potential difference between the voltage of the first input terminal and a voltage of a third voltage line or a potential difference corresponding thereto,
the fourth transistor makes or breaks electric connection between the first terminal and the fourth voltage line in response to a potential difference between a voltage of the second input terminal and a voltage of a fourth voltage line or a potential difference corresponding thereto,
the fifth transistor makes or breaks electric connection between a fifth voltage line and the first terminal in response to a voltage between terminals of the first capacitive element or a voltage corresponding thereto,
the sixth transistor makes or breaks electric connection between the gate of the fifth transistor and the sixth voltage line in response to a potential difference between the voltage of the second input terminal and a voltage of a sixth voltage line or a potential difference corresponding thereto,
the first and second capacitive elements are connected in series between the first input terminal and the gate of the fifth transistor,
an electrical connection point between the first and second capacitive elements is electrically connected to the first terminal, and
the third capacitive element is connected between the first terminal and a gate of the fourth transistor.

2. An inverter circuit comprising:
a first transistor, a second transistor, a third transistor, a fourth transistor, a fifth transistor and a sixth transistor each having channels of same conduction type;
a first capacitive element, a second capacitive element and a third capacitive element; and
a first input terminal, a second input terminal and an output terminal,
wherein a gate of the first transistor is electrically connected to the first input terminal, one terminal of a drain and a source of the first transistor is electrically connected to a first voltage line, and the other terminal of the first transistor is electrically connected to the output terminal,
one terminal of a drain and a source of the second transistor is electrically connected to a second voltage line, and the other terminal of the second transistor is electrically connected to the output terminal,
a gate of the third transistor is electrically connected to the first input terminal, one terminal of a drain and a source of the third transistor is electrically connected to a third voltage line, and the other terminal of the third transistor is electrically connected to a gate of the fifth transistor,
a gate of the fourth transistor is electrically connected to the second input terminal, one terminal of a drain and a source of the fourth transistor is electrically connected to a fourth voltage line, and the other terminal of the fourth transistor is electrically connected to a gate of the second transistor,
one terminal of a drain and a source of the fifth transistor is electrically connected to a fifth voltage line, and the other terminal of the fifth transistor is electrically connected to the gate of the second transistor,
a gate of the sixth transistor is electrically connected to the second input terminal, one terminal of a drain and a source of the sixth transistor is electrically connected to a sixth voltage line, and the other terminal of the sixth transistor is electrically connected to the gate of the fifth transistor, the first and second capacitive elements are connected in series between the first input terminal and the gate of the fifth transistor, an electrical connection point between the first and second capacitive elements is electrically connected to the gate of the second transistor, and the third capacitive element is connected between the gate of the second transistor and the gate of the fourth transistor.

3. The inverter circuit according to claim 2, wherein a pulse signal, which is more advanced in phase than a pulse signal inputted into the second input terminal, is applied to the first input terminal.

4. The inverter circuit according to claim 3, wherein the second capacitive element is connected in a location closer to the first input terminal, and a capacity of the second capacitive element is larger than a capacity of the first capacitive element and a capacity of the third capacitive element.

5. The inverter circuit according to claim 4, wherein the capacity of each of the first to third capacitive elements satisfies the following expressions.

$$C2\ (Vdd1-Vss)/(C1+C2+C3) > Vth5$$

$$C3\ (Vdd1-Vss)/(C1+C2+C3) > Vth5$$

where C1: the capacity of the first capacitive element
C2: the capacity of the second capacitive element
C3: the capacity of the third capacitive element
Vdd1: a voltage of the second voltage line
Vss: a voltage of the first voltage line
Vth5: a threshold voltage of the fifth transistor.

6. The inverter circuit according to claim 5, further comprising a fourth capacitive element connected between the output terminal and the first voltage line.

7. The inverter circuit according to claim 6, wherein the first, third, fourth and sixth voltage lines are maintained at the same potential.

8. The inverter circuit according to claim 7, wherein the second and fifth voltage lines are connected to a power source that outputs a voltage higher than voltages of the first, third and fourth voltage lines.

9. The inverter circuit according to claim 8, wherein the fifth voltage line is connected to a power source that outputs a voltage higher than the voltage of the second voltage line, by at least a threshold voltage of the second transistor.

10. The inverter circuit according to claim 8, further comprising a fifth capacitive element connected between the gate of the second transistor and the output terminal, wherein the second and fifth voltage lines are maintained at the same potential.

11. An inverter circuit comprising:
a first transistor, a second transistor, a third transistor and a fourth transistor each having channels of same conduction type;
a first capacitive element, a second capacitive element and a third capacitive element; and
a first input terminal, a second input terminal and an output terminal,
wherein the first transistor makes or breaks electric connection between the output terminal and the first voltage line in response to a potential difference between a voltage of the second input terminal and a voltage of a first voltage line or a potential difference corresponding thereto, the second transistor makes or breaks electric connection between a second voltage line and the output terminal in response to a potential difference between a gate voltage of the second transistor and a voltage of the output terminal or a potential difference corresponding thereto, the third transistor makes or breaks electric connection between a gate of the second transistor and the third voltage line in response to a potential difference between a voltage of the first input terminal and a voltage of a third voltage line or a potential difference corresponding thereto, the fourth transistor makes or breaks electric connection between the gate of the second transistor and the fourth voltage line in response to a potential difference between the voltage of the second input terminal and a voltage of a fourth voltage line or a potential difference corresponding thereto, the first and second capacitive elements are connected in series between the first input terminal and the gate of the second transistor, an electrical connection point between the first and second capacitive elements is electrically connected to the output terminal, and the third capacitive element is connected between the second input terminal and the output terminal.

12. An inverter circuit comprising:
a first transistor, a second transistor, a third transistor and a fourth transistor each having channels of same conduction type;
a first capacitive element, a second capacitive element and a third capacitive element; and
a first input terminal, a second input terminal and an output terminal,
wherein a gate of the first transistor is electrically connected to the second input terminal, one terminal of a drain and a source of the first transistor is electrically connected to a first voltage line, and the other terminal of the first transistor is electrically connected to the output terminal, one terminal of a drain and a source of the second transistor is electrically connected to a second voltage line, and the other terminal of the second transistor is electrically connected to the output terminal, a gate of the third transistor is electrically connected to the first input terminal, one terminal of a drain and a source of the third transistor is electrically connected to a third voltage line, and the other terminal of the third transistor is electrically connected to a gate of the second transistor, a gate of the fourth transistor is electrically connected to the second input terminal, one terminal of a drain and a source of the fourth transistor is electrically connected to a fourth voltage line, and the other terminal of the fourth transistor is electrically connected to the gate of the second transistor, the first and second capacitive elements are connected in series between the first input terminal and the gate of the second transistor, an electrical connection point between the first and second capacitive elements is electrically connected to the output terminal, and the third capacitive element is connected between the second input terminal and the output terminal.

13. The inverter circuit according to claim 12, wherein a pulse signal, which is more advanced in phase than a pulse signal inputted into the first input terminal, is applied to the second input terminal.

14. The inverter circuit according to claim 12, wherein a pulse signal, which is more advanced in phase than a pulse signal inputted into the second input terminal, is applied to the first input terminal.

15. The inverter circuit according to claim 14, wherein the second capacitive element is connected in a location closer to the first input terminal, and
a capacity of the second capacitive element is larger than a capacity of the first capacitive element and a capacity of the third capacitive element.

16. The inverter circuit according to claim 14, wherein a capacity of the third capacitive element is larger than a capacity of the first capacitive element and a capacity of the second capacitive element.

17. A display device comprising:
a display section that includes a plurality of scanning lines arranged in rows, a plurality of signal lines arranged in columns and a plurality of pixels arranged in rows and columns; and
a drive section that drives each of the pixels,
wherein the drive section includes a plurality of inverter circuits each provided for each of the scanning lines,
each of the inverter circuits includes
a first transistor, a second transistor, a third transistor, a fourth transistor, a fifth transistor and a sixth transistor each having channels of same conduction type;
a first capacitive element, a second capacitive element and a third capacitive element; and
a first input terminal, a second input terminal and an output terminal,
the first transistor makes or breaks electric connection between the output terminal and a first voltage line in response to a potential difference between a voltage of the first input terminal and a voltage of the first voltage line or a potential difference corresponding thereto,
the second transistor makes or breaks electric connection between a second voltage line and the output terminal in response to a potential difference between a voltage of a first terminal and a voltage of the output terminal or a potential difference corresponding thereto, the first terminal being a source or a drain of the fifth transistor,
the third transistor makes or breaks electric connection between a gate of the fifth transistor and the third voltage line in response to a potential difference between the voltage of the first input terminal and a voltage of a third voltage line or a potential difference corresponding thereto,
the fourth transistor makes or breaks electric connection between the first terminal and the fourth voltage line in response to a potential difference between a voltage of the second input terminal and a voltage of a fourth voltage line or a potential difference corresponding thereto,
the fifth transistor makes or breaks electric connection between a fifth voltage line and the first terminal in response to a voltage between terminals of the first capacitive element or a voltage corresponding thereto,
the sixth transistor makes or breaks electric connection between the gate of the fifth transistor and the sixth voltage line in response to a potential difference between the voltage of the second input terminal and a voltage of a sixth voltage line or a potential difference corresponding thereto,
the first and second capacitive elements are connected in series between the first input terminal and the gate of the fifth transistor,
an electrical connection point between the first and second capacitive elements is electrically connected to the first terminal, and
the third capacitive element is connected between the first terminal and a gate of the fourth transistor.

18. A display device comprising:
a display section that includes a plurality of scanning lines arranged in rows, a plurality of signal lines arranged in columns and a plurality of pixels arranged in rows and columns; and
a drive section that drives each of the pixels,
wherein the drive section includes a plurality of inverter circuits each provided for each of the scanning lines,
each of the inverter circuits includes
a first transistor, a second transistor, a third transistor and a fourth transistor each having channels of same conduction type;
a first capacitive element, a second capacitive element and a third capacitive element; and
a first input terminal, a second input terminal and an output terminal,
the first transistor makes or breaks electric connection between the output terminal and the first voltage line in response to a potential difference between a voltage of the second input terminal and a voltage of a first voltage line or a potential difference corresponding thereto,
the second transistor makes or breaks electric connection between a second voltage line and the output terminal in response to a potential difference between a gate voltage of the second transistor and a voltage of the output terminal or a potential difference corresponding thereto,
the third transistor makes or breaks electric connection between a gate of the second transistor and the third voltage line in response to a potential difference between a voltage of the first input terminal and a voltage of a third voltage line or a potential difference corresponding thereto,
the fourth transistor makes or breaks electric connection between the gate of the second transistor and the fourth voltage line in response to a potential difference between the voltage of the second input terminal and a voltage of a fourth voltage line or a potential difference corresponding thereto,
the first and second capacitive elements are connected in series between the first input terminal and the gate of the second transistor,
an electrical connection point between the first and second capacitive elements is electrically connected to the output terminal, and
the third capacitive element is connected between the second input terminal and the output terminal.

* * * * *